US006878957B2

(12) United States Patent
Kuwabara

(10) Patent No.: US 6,878,957 B2
(45) Date of Patent: Apr. 12, 2005

(54) IMAGE DETECTOR AND FABRICATING METHOD OF THE SAME, IMAGE RECORDING METHOD AND RETRIEVING METHOD, AND IMAGE RECORDING APPARATUS AND RETRIEVING APPARATUS

(75) Inventor: Takao Kuwabara, Kaisei-machi (JP)

(73) Assignee: Fuji Photo Film Co., Ltd., Kanagawa-Ken (JP)

( * ) Notice: Subject to any disclaimer, the term of this patent is extended or adjusted under 35 U.S.C. 154(b) by 218 days.

(21) Appl. No.: 10/190,519

(22) Filed: Jul. 9, 2002

(65) Prior Publication Data

US 2003/0010942 A1 Jan. 16, 2003

(30) Foreign Application Priority Data

Jul. 11, 2001 (JP) ........................................ 2001-211028

(51) Int. Cl.[7] ................................................. G01T 1/16
(52) U.S. Cl. ....................................... 250/580; 250/591
(58) Field of Search ................................ 250/591, 580, 250/370.08, 370.09; 378/28, 31

(56) References Cited

U.S. PATENT DOCUMENTS

| 4,535,468 A | 8/1985 | Kempter |
| 4,857,723 A | 8/1989 | Modisette |
| 5,331,179 A | 7/1994 | Lee et al. |
| 5,925,890 A | 7/1999 | Van Den Bogaert et al. |
| 2002/0179868 A1 * | 12/2002 | Shoji ........................... 250/580 |

FOREIGN PATENT DOCUMENTS

| JP | 6-217322 | 8/1994 |
| JP | 7072258 | 3/1995 |
| JP | 7116154 | 5/1995 |
| JP | 7193751 | 7/1995 |
| JP | 9-5906 | 1/1997 |
| JP | 10232824 | 9/1998 |
| JP | 10271374 | 10/1998 |

* cited by examiner

Primary Examiner—Albert Gagliardi
(74) Attorney, Agent, or Firm—Sughrue Mion, PLLC

(57) ABSTRACT

An image detector for use has a constitution of serial lamination of a first stripe electrode, a first rectifying layer with multiple photodiodes which takes on conductivity upon receiving irradiation of recording light, a second rectifying layer with multiple diodes of a reverse polarity to the first rectifying layer, and a second stripe electrode. Upon recording, a voltage is applied between the first stripe electrode and the second stripe electrode, whereby uniform electric charges are accumulated in the capacitor. Then, the recording light is irradiated from the first stripe electrode side, so that electric charges for a latent image on the capacitor are annihilated in accordance with a dosage of the recording light. Upon retrieval, a given voltage is applied between each of elements on the first stripe electrode and elements on the second stripe electrode, whereby a charged currents flowing into the image detector 10 is detected.

16 Claims, 16 Drawing Sheets

X-Y CROSS SECTION

X-Z CROSS SECTION

X-Y CROSS SECTION

X-Z CROSS SECTION

ENLARGED VIEW OF
X-Y CROSS SECTION

X-Y CROSS SECTION

X-Z CROSS SECTION

X-Y CROSS SECTION

X-Z CROSS SECTION

X-Y CROSS SECTION

X-Z CROSS SECTION

IMAGE DETECTOR AND FABRICATING METHOD OF THE SAME, IMAGE RECORDING METHOD AND RETRIEVING METHOD, AND IMAGE RECORDING APPARATUS AND RETRIEVING APPARATUS

BACKGROUND OF THE INVENTION

1. Field of the Invention

The present invention relates to an image detector including a capacitor for accumulating electric charges in an amount corresponding to an amount of an electromagnetic wave irradiated for recording. The present invention also relates to a method and an apparatus for recording image information on the capacitor as an electrostatic latent image by use of the detector and for retrieving the recorded electrostatic latent image.

2. Description of the Related Art

Facsimiles, copiers, radiation imaging apparatuses and the like, for example, are conventionally known as apparatuses using image detectors.

For example, in a radiation image recording apparatus for medical use or the like, methods are known for reducing a radiation dosage exposed to a subject and for improving diagnostic performance. According to such methods, a solid state radiation detector (an electrostatic recording medium) including a photoconductor (layer) such as a selenium plate, which is sensitive to radiation such as X-rays, is used as an image detector. The X-rays are irradiated onto the solid state radiation detector, and electric charges in an amount corresponding to a dosage of the irradiated radiation are accumulated in a capacitor inside the solid state radiation detector as electric charges for a latent image. In this way, radiation image information is recorded on the capacitor as an electrostatic latent image. Meanwhile, the solid state radiation detector recording the radiation image information is scanned with a laser beam or a line light source, whereby the radiation image information is retrieved out of the solid state radiation detector (as disclosed in Japanese Unexamined Patent Publication No. 6 (1994)-217322, U.S. Pat. No. 4,857,723 and Japanese Unexamined Patent Publication No. 9(1997)-5906, for example).

The method disclosed in the above-mentioned Japanese Unexamined Patent Publication No. 6(1994)-217322 uses a solid state radiation detector formed by stacking a conductor layer, an X-ray photoconductive layer, a dielectric layer, and an electrode layer including multiple microplates corresponding to pixels, in which a charge retrieving thin-film transistor (TFT) is connected to each of the microplates. X-rays which are transmitted through an imaging object are irradiated onto the solid state radiation detector, so that electric charges for a latent image are accumulated in a capacitor formed between the microplates and the conductor layer. Accordingly, radiation image information is recorded on the solid state radiation detector. Thereafter, the electric charges for a latent image accumulated in the capacitor are read out to an outside of the solid state radiation detector by scan-driving the TFT. In this way, the radiation image information is retrieved.

Meanwhile, the method disclosed in the above-mentioned U.S. Pat. No. 4,857,723 uses a solid state radiation detector having a constitution of sandwiching both sides of a photoconductive layer with insulating layers, and further sandwiching the above-described object with stripe electrodes which include multiple line electrodes orthogonalized between the stripe electrodes on one side and the other side. X-rays which are transmitted through an imaging object are irradiated onto the solid state radiation detector, so that electric charges for latent images of mutually different polarities are accumulated in two capacitors, which are severally formed on interfaces between the photoconductive layer and the insulating layers in intersecting positions of the stripe electrodes on the both sides. Accordingly, radiation image information is recorded on the solid state radiation detector. Thereafter, the solid state radiation detector is scanned with a laser beam as retrieving light, whereby the electric charges for latent images accumulated in the capacitors are read out to an outside of the solid state radiation detector. In this way, the radiation image information is retrieved.

Meanwhile, the method disclosed in the above-mentioned Japanese Unexamined Patent Publication No. 9(1997)-5906 uses a solid state radiation detector formed by stacking a first electrode layer, a recording photoconductive layer, a trap layer as a capacitor, a retrieving photoconductive layer and a second electrode layer in accordance with the order listed above. Uniform exposure light is irradiated in the state where high voltages are applied to electrodes provided on both sides in advance, thereby forming primary electrification at a capacitor of the detector. Thereafter, the both electrodes are either short-circuited, subjected to application of high voltages, or set open. In the state where electric fields are thus caused on the recording photoconductive layer, X-rays which are transmitted through an imaging object are irradiated onto the solid state radiation detector, so that electric charges for a latent image are accumulated in a capacitor. Accordingly, radiation image information is recorded on the solid state radiation detector. Thereafter, the both electrodes are short-circuited and then the solid state radiation detector is scanned with a laser beam as retrieving light, whereby the electric charges for a latent image accumulated in the capacitor are read out to an outside of the solid state radiation detector. In this way, the radiation image information is retrieved.

Furthermore, there has been disclosed a method of recording and retrieving a radiation image, which does not require provision of the charge retrieving TFT inside the electrode layer including the microplates unlike the method disclosed in the Japanese Unexamined Patent Publication No. 6(1994)-217322. Moreover, this method does not require a very expensive laser scanning system of a complex structure for reading out the electric charges of latent images accumulated inside the detector unlike the method disclosed in the U.S. Pat. No. 4,857,723. Further, this method does not require a light source for the primary electrification for forming the primary electrification at the capacitor of the detector unlike the method disclosed in Japanese Unexamined Patent Publication No. 9(1997)-5906. The method of recording and retrieving a radiation image includes the steps of: using a radiation image detector by stacking a first stripe electrode having multiple line electrodes, a photoconductive layer which takes on conductivity by receiving irradiation of an electromagnetic wave for recording, a capacitor, a rectifying layer formed with multiple diodes, and a second stripe electrode including multiple line electrodes formed as almost orthogonal to the first stripe electrode in accordance with the order listed above; applying a voltage between the both stripe electrodes; accumulating uniform electric charges on the capacitor; irradiating the electromagnetic wave for recording from the first stripe electrode side; and recording a radiation image by erasing the electric charges for a latent image on the capacitor in accordance with an amount of the electromagnetic wave. The method further includes the steps of: applying a given voltage severally between each line electrode of the first stripe electrode and the respective line electrodes of the second stripe electrode; and detecting a charged current flowing into the radiation image detector owing to application of the voltage with a current detection circuit connected between the respective line electrodes of the first stripe electrode and the second stripe electrode for performing retrieval.

However, the above-described radiation image recording and retrieving method performs recording by accumulating the electric charges for a latent image corresponding to the radiation image information into the capacitor, and the electric charges for a latent image also discharges electricity prior to retrieval. For example, a high-resistance (about $10^{14}$ to $10^{15}\Omega$) photoconductive layer is formed if the photoconductive layer is made of a member mainly composed of a-Se. Accordingly, if the electric charges for a latent image accumulated in the capacitor are discharged from the photoconductive layer, such an amount of discharge is insignificant. On the contrary, if the photoconductive layer is made of a member mainly composed of a-Si, then it is difficult to form the photoconductive layer highly resistant as in the case of a-Se, whereby the photoconductive layer possesses relatively low resistance (about $10^4$ to $10^{12}\Omega$). Accordingly, an amount of discharge of the electric charges for a latent image from the capacitor cannot be ignored, and image quality such as an S/N ratio or sharpness is deteriorated upon image retrieval.

SUMMARY OF THE INVENTION

The present invention has been made in consideration of the foregoing problem. An object of the present invention is to provide an image detector capable of suppressing discharge of electric charges for a latent image corresponding to image information accumulated in a capacitor, and to provide a method of fabricating the same. Another object of the present invention is to provide a method of and an apparatus for recording the image information on the image detector. Still another object of the present invention is to provide a method of and an apparatus for retrieving the image information out of the image detector which records the image information.

An image detector according to the present invention is an image detector which includes a capacitor for accumulating electric charges corresponding to an amount of an electromagnetic wave irradiated for recording and which records image information on the capacitor as electric charges for a latent image. Here, the image detector includes a first electrode layer having a first stripe electrode composed of multiple line electrodes, a first rectifying layer which takes on conductivity by receiving irradiation of the electromagnetic wave for recording, a capacitor, a second rectifying layer having a reverse polarity to the first rectifying layer, and a second electrode layer having a second stripe electrode composed of multiple line electrodes intersecting the line electrodes of the first stripe electrode, in which the foregoing constituents are stacked in accordance with the order listed above.

Here, the foregoing "electromagnetic wave for recording" refers to an electromagnetic wave incident on the detector. Radiation such as X-rays or light (not limited to visible light), for example, can be used as the electromagnetic wave so far as the electromagnetic wave can carry image information. Moreover, the electromagnetic wave usable therein may be light emitted by excitation of a primary electromagnetic wave (the foregoing radiation or light) emitted from an electromagnetic wave source, the light having a different wavelength from the wavelength of the primary electromagnetic wave.

Moreover, the foregoing "line electrodes" refer to electrodes having an elongate shape on the whole. The line electrodes may be of cylinder shapes, columnar shapes or any other shapes so far as they are elongate in shape. However, flat-plate electrodes are preferred in particular. Upon disposing the line electrodes of the first stripe electrode so as to intersect the line electrodes of the second stripe electrode, it is preferable to arrange those two sets of line electrodes to intersect almost orthogonally to each other.

Moreover, the foregoing "rectifying layer" refers to a layer having a rectifying action, which allows an electric current to flow in one direction without hindrance but hardly allows the electric current to flow in the reverse direction. In particular, the above-described first rectifying layer is designed to take on conductivity by receiving irradiation of the electromagnetic wave for recording, thereby holding electric charges generated. For example, the rectifying layer refers to a layer composed of multiple photodiodes. Moreover, the above-described first rectifying layer having a rectifying action so as to suppress discharge of electric charges for a latent image accumulated in the capacitor toward the first electrode layer.

Moreover, each of the first and the second rectifying layers is made of an n-type semiconductor, an insulator and a p-type semiconductor. Here, at least any one of the n-type semiconductors and the p-type semiconductors of the first and the second rectifying layers disposed opposite to the capacitor is two-dimensionally partitioned into pixels so as to correspond to pixel positions defined by the first stripe electrode and the second stripe electrode. Moreover, it is preferable that at least any one of the n-type semiconductors and the p-type semiconductors of the first and the second rectifying layers disposed opposite to the relevant stripe electrodes is partitioned into pixels in any of a stripe (one-dimensional) manner so as to correspond to the relevant stripe electrode and a two-dimensional manner so as to correspond to the pixel positions, that is, in a manner of partitioning into pixels in the both directions of arrangements of the stripe electrodes.

Here, the foregoing "pixel positions defined by the first stripe electrode and the second stripe electrode" refer to spatial positions between the both stripe electrodes which are defined by three-dimensional intersection of the both stripe electrodes. Such spatial positions do not always coincide with the positions of intersection exactly but may move slightly depending on a method of forming the capacitor. For example, if the capacitor is made of the conductive member as described later, the pixel positions may be influenced by arrangement positions of the conductive member.

Moreover, the foregoing "any one of the n-type semiconductors and the p-type semiconductors of the first and the second rectifying layers disposed opposite to the relevant stripe electrode" refers to the n-type semiconductor or the p-type semiconductor disposed opposite to the first stripe electrode in the case of the first rectifying layer; alternatively, the n-type semiconductor or the p-type semiconductor disposed opposite to the second stripe electrode in the case of the second rectifying layer.

Etching may be used in order to partition the p-type semiconductor or the n-type semiconductor in the above-described manner. The image detector of the above-described mode will be hereinafter referred to as an image detector with pixel-partitioned rectifying layers.

Note that the insulators to be disposed between the n-type semiconductors and the p-type semiconductors of the first and the second rectifying layers may be also partitioned into pixels in any of a stripe (one-dimensional) manner so as to correspond to the first or the second stripe electrode and a two-dimensional manner so as to correspond to the pixel positions.

In the image detector according to the present invention, it is satisfactory if the capacitor for accumulating the electric charges for a latent image is formed on an inside of the first rectifying layer or in the vicinity of the inside thereof. However, it is preferred that the capacitor is particularly made of a conductive member, which is provided independently of the pixel positions and each element thereof is electrically unconnected to one another, thereby setting the electric charges for a latent image to the same electric potential.

In the image detector according to the present invention, it is preferred that a fluorescent material, which emits light with a different wavelength from the wavelength of the electromagnetic wave for recording caused by excitation of the electromagnetic wave, is provided on an outside of the first electrode layer.

It is preferred that the second rectifying layer of the image detector according to the present invention possesses transmittance with respect to the electromagnetic wave for recording.

The foregoing "electromagnetic wave for recoding" also includes light with a different wavelength from the wavelength of the electromagnetic wave for recording which is emitted from the fluorescent material, for example.

In order to impart the above-described transmittance with respect to the second rectifying layer, the second rectifying layer may be made of a material which possesses transmittance with respect to the electromagnetic wave for recording, for example.

Alternatively, the second rectifying layer may be composed of multiple rectifier elements formed by etching such that a size of each element is designed as ⅔ or smaller than a minimum resolvable pixel size, and spaces between the respective rectifier elements are made of a material which possesses transmittance with respect to the electromagnetic wave for recording or the light with the different wavelength from the wavelength of the electromagnetic wave which is emitted by excitation of the electromagnetic wave for recording.

In the case when the insulator between the n-type semiconductor and the p-type semiconductor of the second rectifying layer is also partitioned into pixels in any of a stripe (one-dimensional) manner so as to correspond to the first or the second stripe electrode and a two-dimensional manner so as to correspond to the pixel positions as described above, the entire second rectifying layer is partitioned so as to correspond to the stripe electrode or the pixel positions. Accordingly, light can be transmitted through spaces between the partitioned members. As a result, in the detector of the above-described mode, the second rectifying layer virtually possesses transmittance with respect to the electromagnetic wave for recording.

In the image detector according to the present invention, it is more preferable if the fluorescent material emitting the light with the different wavelength from the wavelength of the electromagnetic wave for recording by excitation of the electromagnetic wave for recording is provided on an outside of the second electrode layer.

A method of fabricating the image detector according to the present invention is a method for fabricating the image detector with pixel-partitioned rectifying layers, and includes the steps of: forming the second electrode layer; forming a semiconductor of a first type, which is selected from any of an n-type semiconductor and a p-type semiconductor, into a film on the second electrode layer; etching the semiconductor film of the first type so as to be disposed opposite to the second stripe electrode; forming the insulator of the second rectifying layer on the etched semiconductor film of the first type; forming a semiconductor of a second type, which is selected from any of the n-type semiconductor and the p-type semiconductor and is reverse to the first type, into a film on the insulator; etching the semiconductor film of the second type so as to be disposed opposite to the second stripe electrode and to form desired pixel pitch and pixel width in a longitudinal direction of the second stripe electrode; forming the capacitor on the etched semiconductor film of the second type; forming another semiconductor of the same type as the second type into a film on the capacitor; etching the semiconductor film of the same type as the second type so as to be disposed opposite to the capacitor; forming the insulator of the first rectifying layer on the etched semiconductor film of the same type as the second type; forming a semiconductor of the same type as the first type into a film on the insulator; etching the semiconductor film of the same type as the first type so as to be disposed opposite to a position of arrangement of the etched semiconductor film of the same type as the second type and to be formed in a stripe manner while intersecting the second stripe electrode; forming an electrode material to constitute the first electrode layer into a film on the etched semiconductor film of the same type as the first type; and etching the first stripe electrode in a stripe manner so as to be disposed opposite to the etched semiconductor film of the same type as the first type.

In the foregoing fabricating method, the above-mentioned any one of the n-type semiconductor and the p-type semiconductor on the second rectifying layer may be etched so as to form desired pixel pitch and pixel width in the longitudinal direction of the second stripe electrode. In other words, the above-mentioned mode is equivalent to pixel partitioning into both the direction of arrangement of the second stripe electrode and the direction of arrangement of the first stripe electrode (the longitudinal direction of the second stripe electrode). Moreover, the semiconductor on the first rectifying layer of the same type as the first type, which is any one of the n-type semiconductor and the p-type semiconductor, may be etched so as to form desired pixel pitch and pixel width in the longitudinal direction of the first stripe electrode. In other words, the above-mentioned mode is equivalent to pixel partitioning into both the direction of arrangement of the first stripe electrode and the direction of arrangement of the second stripe electrode (the longitudinal direction of the first stripe electrode).

An image recording method according to the present invention is an image recording method for recording image information on a capacitor as an electrostatic latent image by irradiating an electromagnetic wave for recording onto the image detector and thereby accumulating electric charges in an amount corresponding to an amount of the electromagnetic wave on the capacitor. Here, the image recording method includes the steps of accumulating almost uniform electric charges in the capacitor by applying a given voltage between the first stripe electrode and the second stripe electrode; and stopping application of the voltage and irradiating the electromagnetic wave for recording onto the image detector to perform recording.

Here, the foregoing "irradiating the electromagnetic wave for recording" refers to an act of irradiating the electromagnetic wave for recording, such as radiation transmitted through an imaging object, directly onto the detector. However, without limitations to the foregoing, the act of irradiation also includes indirect irradiation of light emitted by excitation of the electromagnetic wave for recording, such as fluorescent light which is generated inside scintillator (the fluorescent material) by irradiating the radiation for recording onto the scintillator.

Moreover, in the case of the recording method using a detector without lamination of a fluorescent material as the image detector, a fluorescent material for emitting light with a different wavelength from the wavelength of the electromagnetic wave for recording caused by excitation of the electromagnetic wave may be provided so as to face the first electrode layer and/or the second electrode layer, whereby the light emitted from the fluorescent material may be irradiated on the detector.

Further in this case, the fluorescent material for emitting the light with the different wavelength from the wavelength of the electromagnetic wave for recording caused by excitation of the electromagnetic wave may be provided so as to face any one of the first electrode layer and the second electrode layer, and the electromagnetic wave for recording may be irradiated on the electrode layer on which the fluorescent material is not provided.

Similarly, in the case of the recording method using the detector provided with the fluorescent material only on the outside of any one of the first electrode layer and the second electrode layer as the image detector, the electromagnetic wave for recording may be irradiated on the electrode layer on which the fluorescent material is not provided.

An image retrieving method according to the present invention is an image retrieving method for retrieving image information from the image detector which records the image information as an electrostatic latent image. Here, the image retrieving method includes the steps of applying a voltage between each line electrode of the first stripe electrode and the line electrodes of the second stripe electrode, and obtaining an electric signal at a level corresponding to an amount of electric charges accumulated in the capacitor by detecting a charged current flowing into the image detector owing to application of the voltage.

An image recording apparatus according to the present invention is an image recording apparatus for recording image information on the capacitor as an electrostatic latent image by irradiating the electromagnetic wave for recording on the image detector so as to accumulate electric charges on the capacitor in an amount corresponding to a dosage of the electromagnetic wave. Here, the image recording apparatus includes recording voltage applying means for applying a given voltage between the first stripe electrode and the second stripe electrode and thereby accumulating almost uniform electric charges in the capacitor, and controlling means for controlling the recording voltage applying means and irradiation of the electromagnetic wave such that the electromagnetic wave for recording is irradiated on the image detector after stopping application of the given voltage.

An image retrieving apparatus according to the present invention is an image retrieving apparatus for retrieving image information from the image detector which records the image information as an electrostatic latent image. Here, the image retrieving apparatus includes retrieving voltage applying means for applying a given voltage between each line electrode of the first stripe electrode and the line electrodes of the second stripe electrode, and image signal obtaining means for obtaining an electric signal at a level corresponding to an amount of electric charges accumulated on the capacitor by detecting a charged current flowing into the image detector owing to application of the voltage.

Upon application of the given voltage between each line electrode of the first stripe electrode and the line electrodes of the second stripe electrode, it is preferable to apply the voltage by serially switching in the longitudinal direction of the line electrode of the second stripe electrode from one end thereof to the other end thereof.

The image detector according to the present invention includes the first electrode layer having the first stripe electrode composed of multiple line electrodes, the first rectifying layer which takes on conductivity by receiving irradiation of the electromagnetic wave for recording, the capacitor, the second rectifying layer having the reverse polarity to the first rectifying layer, and the second electrode layer having the second stripe electrode composed of multiple line electrodes intersecting the line electrodes of the first stripe electrode, in which the foregoing constituents are stacked in accordance with the order listed above. Therefore, it is possible to suppress electric discharge of the electric charges for a latent image corresponding to the image information accumulated in the capacitor, thus enhancing image quality of the image retrieved from the image detector.

Moreover, each of the first and the second rectifying layer is composed of the n-type semiconductor, the insulator and the p-type semiconductor. Here, at least any one of the n-type semiconductor and the p-type semiconductor of the first and the second rectifying layer disposed opposite to the capacitor may be two-dimensionally partitioned into pixels so as to correspond to the pixel positions defined by the first stripe electrode and the second stripe electrode. Moreover, at least any one of the n-type semiconductors and the p-type semiconductors of the first and the second rectifying layers disposed opposite to the relevant stripe electrodes may be partitioned into pixels in any of a stripe (one-dimensional) manner so as to correspond to the relevant stripe electrode and a two-dimensional manner so as to correspond to the pixel positions, that is, in a manner of partitioning into pixels in the both directions of arrangements of the stripe electrodes. In that case, it is possible to further suppress movement of the electric charges for a latent image on the capacitor, whereby the image quality can be enhanced further.

Moreover, if the detector includes the capacitor which is formed by providing multiple conductive members independently of the pixels, then it is also possible to enhance sharpness upon recording.

Furthermore, if the capacitor is made of the conductive members (microplates), which are provided independently of pixel positions in electrically unconnected states severally in order to render electric potential equalization to the electric charges for a latent image, then it is possible to equalize the electric potential of each of the electric charges for a latent image of the respective pixels accumulated on the conductive members. In this way, it is possible to form the capacitor favorably as compared with a case without providing the conductive materials, and retrieving efficiency can be also improved. It is because the electric potential of the electric charges for a latent image is maintained constant in a range of the conductive members. To be more precise, when the conductive members are provided, the conductive members can move the electric charges for a latent image in the peripheries of the pixels, which are hardly retrievable in general, toward central parts of the pixels in process of retrieval as far as the electric charges exist within the conductive members, and thus the conductive members effectuate more sufficient discharge of the electric charges of a latent image.

Moreover, if the detector provided with lamination of the fluorescent material is adopted, it is possible to convert the radiation for recording once into fluorescent light and to irradiate the fluorescent light onto the first rectifying layer. Accordingly, efficiency of charge generation can be enhanced by use of a more appropriate fluorescent material, whereby an S/N ratio of the image can be enhanced and the dosage of the radiation can be also reduced in order to decrease a radiation exposure dosage received by the imaging object.

Furthermore, if transmittance with respect to the electromagnetic wave for recording is imparted to the second rectifying layer and the capacitor, then it is possible to detect the radiation or the fluorescent light from a front side as well as a back side, whereby sensitivity is improved.

Moreover, according to the method of fabricating an image detector of the present invention, it is relatively easy to fabricate the image detector capable of accumulating and retrieving the electric charges for a latent image in and from the proper pixel positions and thereby reproducing a fine image, by means of etching and partitioning the n-type semiconductor and the p-type semiconductor (and more preferably the insulator as well) which constitute the first and the second rectifying layers in the above-described manner.

Furthermore, according to the image recording method and apparatus of the present invention, the above-described image detector is used, and uniform electric charges are accumulated in the capacitor by applying a voltage between the both stripe electrodes of the image detector. Thereafter, electric charges for a latent image, which carry image information, are accumulated in the capacitor by irradiating the light for recording. Therefore, it is possible to obtain the above-described effects of the image detector with a simpler constitution Furthermore, according to the image retrieving method and apparatus of the present invention, the above-described image detector is used, and the given voltage is applied between each line electrode of the first stripe electrode and the line electrodes of the second stripe electrode of the image detector. Further, the electric signal at the level corresponding to the amount of the electric charges accumulated in the capacitor is obtained by detecting the charged current flowing into the image detector owing to application of the voltage. Therefore, it is possible to obtain the above-described effects of the image detector with a simpler constitution.

BRIEF DESCRIPTION OF THE DRAWINGS

FIGS. 1A to 1C are views showing a schematic constitution of a solid state radiation detector adopting a first embodiment of an image detector according to the present invention, wherein FIG. 1A is a perspective view thereof, FIG. 1B is an X–Y cross-sectional view in a position indicated with an arrow P in FIG. 1A, and FIG. 1C is an X–Z cross-sectional view in a position indicated with an arrow Q in FIG. 1A.

FIGS. 2A to 2D are views showing a schematic constitution of the detector in a mode of partitioning rectifying layers into pixels, wherein FIG. 2A is a perspective view thereof, FIG. 2B is an X–Y cross-sectional view in a position indicated with an arrow P in FIG. 2A, FIG. 2C is an X–Z cross-sectional view in a position indicated with an arrow Q in FIG. 2A, and FIG. 2D is an enlarged view in the vicinity of rectifier elements.

FIGS. 5A and 5B are views showing a process of accumulating uniform electric charges in a case of using the solid state radiation detector according to the first embodiment, wherein FIG. 5A is an electric charge model and FIG. 5B is an equivalent circuit diagram.

FIGS. 6A to 6D are views showing a process of recording an electrostatic latent image in the case of using the solid state radiation detector according to the first embodiment, wherein FIGS. 6A to 6C are electric charge models and FIG. 6D is an equivalent circuit diagram.

FIGS. 9A to 9C are views showing a schematic constitution of a solid state radiation detector adopting a second embodiment of an image detector according to the present invention, wherein FIG. 9A is a perspective view thereof, FIG. 9B is an X–Y cross-sectional view in a position indicated with an arrow P in FIG. 9A, and FIG. 9C is an X–Z cross-sectional view in a position indicated with an arrow Q in FIG. 9A.

FIGS. 13A to 13C are views showing a schematic constitution of a solid state radiation detector adopting a third embodiment of an image detector according to the present invention, wherein FIG. 13A is a perspective view thereof, FIG. 13B is an X–Y cross-sectional view in a position indicated with an arrow P in FIG. 13A, and FIG. 13C is an X–Z cross-sectional view in a position indicated with an arrow Q in FIG. 13A.

DESCRIPTION OF THE PREFERRED EMBODIMENTS

The preferred embodiments of the present invention will now be described with reference to the accompanying drawings.

Figure 1A:
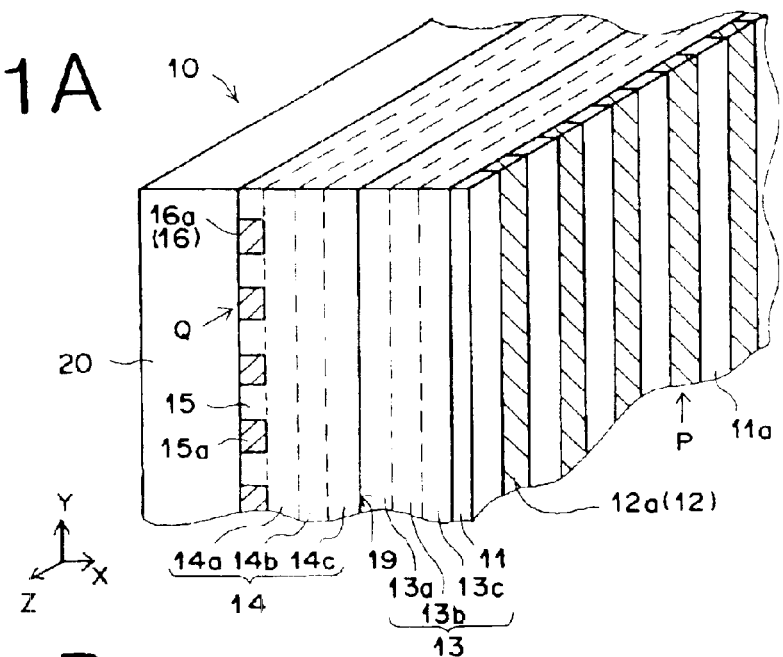
Figure 1B:
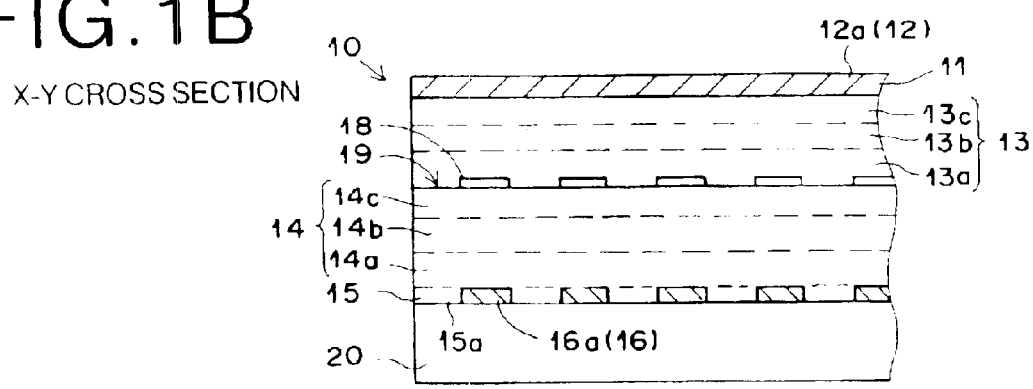
Figure 1C:
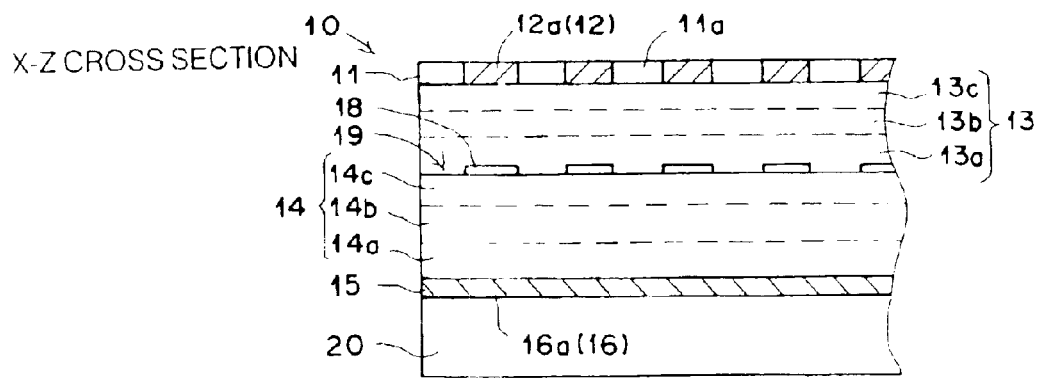

FIGS. 1A to 1C are views showing a schematic constitution of a solid state radiation detector (hereinafter referred to as the detector) adopting a first embodiment of an image detector according to the present invention, in which FIG. 1A is a perspective view thereof, FIG. 1B is an X–Y cross-sectional view in a position indicated with an arrow P in FIG. 1A, and FIG. 1C is an X–Z cross-sectional view in a position indicated with an arrow Q in FIG. 1A.

The detector 10 includes a first electrode layer 11 on which formed is a first stripe electrode 12 composed of an array of multiple flat-plate elements (line electrodes) 12a in a stripe manner, a first rectifying layer 13 which takes on conductivity by receiving irradiation of light for recording (hereinafter referred to as the recording light) L2 which carries image information of an imaging object, a second rectifying layer 14 having a reverse polarity to the first rectifying layer, and a second electrode layer 15 on which formed is a second stripe electrode 16 composed of an array of multiple flat-plate elements 16a in a stripe manner. The detector is formed by stacking the foregoing constituents in accordance with the order listed above. Moreover, the respective layers are disposed on a glass substrate 20 such that the second electrode layer 15 side abuts on an upper surface 20a of the glass substrate 20. In addition, a capacitor 19 for accumulating electric charges for a latent image is formed between the first rectifying layer 13 and the second rectifying layer 14.

Each element 12a of the first stripe electrode 12 is arranged almost orthogonally to each element 16a of the second stripe electrode 16. Each set of the elements are provided in the same number as the number of pixels in a direction of arrangement. Arranging pitch of the elements defines pixel pitch, and each element of the first stripe electrode 12 is preferably set as wide as possible, because an S/N ratio is enhanced when the element becomes wider. Here, the pitch is defined as 100 $\mu$m and the width is defined as 90 $\mu$m, for example. Insulative materials are filled in gaps 11a between the respective elements 12a and gaps 15a between the respective elements 16a. The insulative materials possess transmittance with respect to the recording light L2. The stripe electrodes 12 and 16 are only required to have conductivity, and the elements 12a and 16a may be made of single metal such as gold, silver, aluminum or platinum, or alloys such as indium oxide.

The first rectifying layer 13 is formed by serially stacking a p-type a-Si layer 13c as a p-type semiconductor, an i(intrinsic) a-Si layer 13b as an insulator and an n-type a-Si layer 13a as an n-type semiconductor, starting from the first electrode layer 11 side. In the embodiment, a-Si is used as main ingredients of members for the p-type semiconductor and the n-type semiconductor, and the insulator is provided between the p-type semiconductor and the n-type semiconductor to improve rectification performance. Specifically, the first rectifying layer 13 of the embodiment thereby constitutes a diode (a rectifier element) 13d in which the p-type a-Si layer 13c is an anode and the n-type a-Si layer 13a is a cathode thereof.

Since the first rectifying layer 13 has a p-i-n diode structure including a-Si (amorphous silicon) as the main ingredient as described above, the first rectifying layer 13 takes on conductivity upon irradiation of the recording light L2 and thereby functions as a photodiode. It is preferred to define the thickness of the first rectifying layer 13 as sufficient for absorbing the recording light L2. However, if the first rectifying layer 13 is too thick in comparison with the thickness of the second rectifying layer 14, then retrievable signal currents will be decreased. Therefore, the thickness of the first rectifying layer 13 is defined in accordance with the thickness of the second rectifying layer 14.

Since the respective elements 12a of the first stripe electrode 12 are stacked on the p-type a-Si layer 13c, the elements 12a function as anode terminals. On the contrary, as the n-type a-Si layer 13a is stacked on microplates 18 to be described below, the respective microplates 18 function as cathode terminals. In other words, individual (independent) photodiodes 13d are virtually connected between the respective elements 12a and the respective microplates 18.

With the above-described p-i-n diode structure of the first rectifying layer 13, a reverse bias voltage will be applied to the first rectifying layer 13 in the event of accumulating the electric charges for a latent image in the capacitor 19 (as will be described later in detail). In this way, discharge of the electric charges for a latent image becomes suppressible.

The microplates (conductive members) 18 are arranged in respective pixel positions on an interface of the first rectifying layer 13 and the second rectifying layer 14, that is, on the capacitor 19. The respective pixel positions correspond to intersecting positions of the elements 12a and the elements 16a. The microplates 18 are discretely arranged with intervals provided therebetween, in floating states that the respective microplates 18 are not connected to anywhere.

The size of each microplate 18 is preferably defined to occupy almost as the same range as a pixel size. Note that the sizes of the microplates 18 are not always limited to occupy almost the same sizes as the pixel sizes, but the microplates 18 may also have larger sizes or smaller sizes than the pixel sizes. Here, a minimum resolvable pixel size corresponds to a larger one out of the size of the microplate 18 and an area of intersection of the elements 12a and 16a.

The microplates 18 are deposited between the first rectifying layer 13 and the second rectifying layer 14 by use of vacuum deposition or chemical deposition, for example. It is possible to form the microplates 18 with very thin films (about 100 Å, for example) made of single metal such as gold, silver, aluminum, copper, chromium, titanium or platinum, or alloys such as indium oxide.

The second rectifying layer 14 is formed by serially stacking a p-type a-Si layer 14a as a p-type semiconductor, an i(intrinsic) a-Si layer 14b as an insulator and an n-type a-Si layer 14c as an n-type semiconductor, starting from the glass substrate 20 side. In this way, the second rectifying layer 14 constitutes a diode (a rectifier element) 14d in which the p-type a-Si layer 14a is an anode and the n-type a-Si layer 14c is a cathode thereof. In general, the detector 10 is formed by stacking the respective layers serially on the glass substrate 20. Accordingly, the p-type a-Si layer 14a is stacked after depositing the elements 16a on the glass substrate 20 in this case, whereby p-type a-Si is also filled into the gaps 15a between the elements 16a in the second electrode layer 15.

Note that the referenced drawings are schematic, and the drawings therefore do not correctly reflect correlations among thicknesses of the respective layers, the pixel pitches or the pixel widths. For example, whereas the thickness of the second rectifying layer 14 is illustrated as wider than the width of the elements 12a in the drawings, the thickness of the second rectifying layer 14 is actually set to a thickness substantially smaller than the pixel pitch (which is 100 μm in the foregoing example), which is normally set to about 0.5 μm.

Since the p-type a-Si layer 14a is stacked on the respective elements 16a of the second stripe electrode 16, the respective elements 16a function as anode terminals. On the contrary, as the microplates 18 are stacked on the n-type a-Si layer 14c, the respective microplates 18 function as cathode terminals. In other words, individual (independent) diodes 14d are virtually connected between the respective elements 16a and the respective microplates 18.

When a-Si is used as the main ingredient of the members for the p-type semiconductor, the insulator and the n-type semiconductor as in this embodiment, resistivity between the p-type semiconductor and the n-type conductor may be reduced and charge transfer thereby occurs inside the semiconductors. Such charge transfer may affect image forming. Therefore, in order to avoid the charge transfer, the image detector 10 of the embodiment may adopt the following constitution that at least any one of the N-type a-Si layers 13a and 14c as the n-type semiconductors, which are disposed on the sides to face the capacitor 19 (specifically, on the sides to contact with the microplates 18), is partitioned into pixels so as to correspond to the pixel positions which are the intersecting positions of the elements 12a and 16a. Further, when the n-type a-Si layer 13a is partitioned into pixels, the p-type a-Si layer 13c as the p-type semiconductor, which is disposed on the elements' 12a side of the first stripe electrode 12, may be partitioned into stripes so as to correspond to the elements 12a. Alternatively, when the n-type a-Si layer 14c is partitioned into pixels, the p-type a-Si layer 14a as the p-type semiconductor, which is disposed on the elements' 16a side of the second stripe electrode 16, may be partitioned into stripes so as to correspond to the elements 16a.

Meanwhile, when the n-type a-Si layer 13a is partitioned into pixels, the p-type a-Si layer 13c may be also partitioned in accordance with the longitudinal directions of the elements 12a, so as to conform to the pixel pitches (that is, arrangement pitches of the elements 16a) and the pixel widths. In this case, the p-type a-Si layer 13c is partitioned into pixels so as to correspond to opposite positions to the pixel-partitioned n-type a-Si layer 13a, that is, the pixel positions which are the intersecting positions of the elements 12a and 16a. Alternatively, when the n-type a-Si layer 14c is partitioned into pixels, the p-type a-Si layer 14a may be also partitioned in accordance with the longitudinal directions of the elements 16a, so as to conform to the pixel pitches (that is, arrangement pitches of the elements 12a) and the pixel widths. In this case, the p-type a-Si layer 14a is partitioned into pixels so as to correspond to opposite positions to the pixel-partitioned n-type a-Si layer 14c, that is, the pixel positions which are the intersecting positions of the elements 12a and 16a.

Moreover, the ia-Si layer 14b as the insulator to be disposed between the p-type a-Si layer 14a and the n-type a-Si layer 14c may be also partitioned into stripes so as to correspond to the elements 16a. Further, the ia-Si layer 13b as the insulator to be disposed between the p-type a-Si layer 13c and the n-type a-Si layer 13a may be partitioned into stripes so as to correspond to the elements 12a. Alternatively, any of the ia-Si layers 14b and 13b may be also partitioned into pixels so as to correspond to the pixel positions. In other words, the ia-Si layer 14b or 13b may be partitioned in accordance with desired pixel pitches and pixel widths along the directions of arrangement of the elements 12a and 16b, respectively.

Figure 2A:
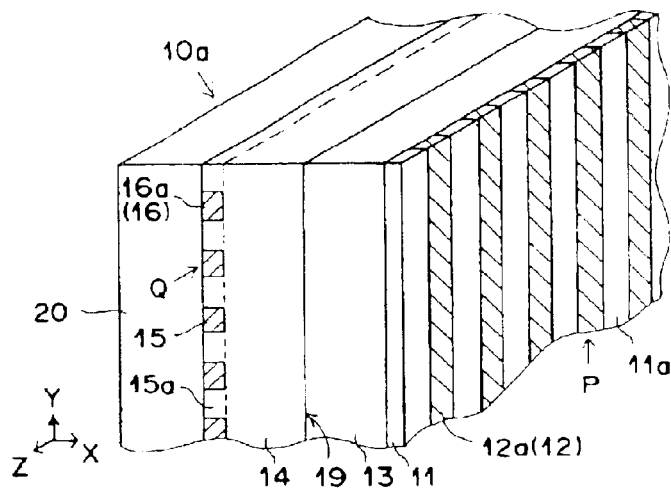
Figure 2B:
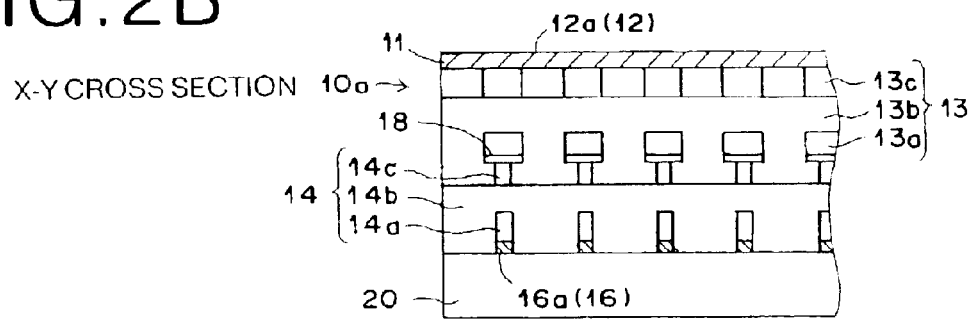
Figure 2C:
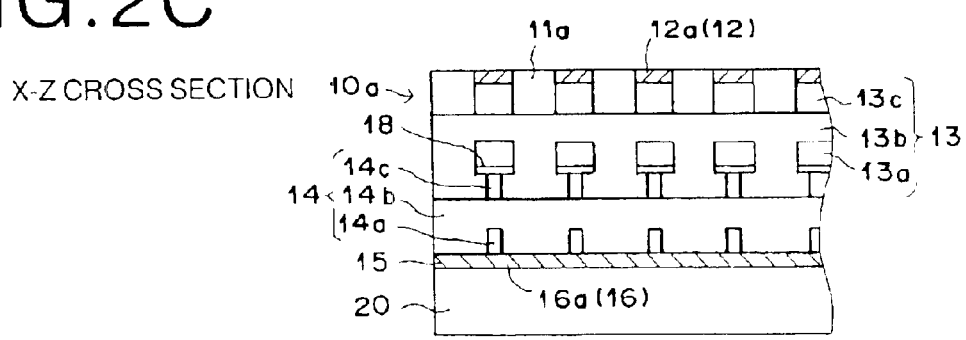
Figure 2D:
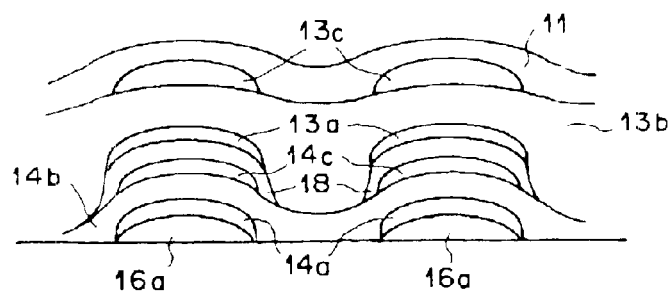

FIGS. 2A to 2C are views for showing a schematic constitution of a detector, in which all the p-type a-Si layers 13c and 14a, and the n-type a-Si layers 13a and 14c are partitioned into pixels so as to correspond to the pixel positions. FIGS. 2A to 2C reflect the same projection modes as FIGS. 1A to 1C, respectively. Moreover, FIG. 2D is an enlarged view in the vicinity of rectifier elements taken along an X–Y cross section of the detector, in which the p-type a-Si layers 13c and 14a, and the n-type a-Si layers 13a and 14c are partitioned into pixels so as to correspond to the pixel positions.

Upon fabricating the detector 10 shown in FIGS. 2A to 2D, it is preferable to adopt the following fabricating method.

First, an electrode material to constitute the second stripe electrode 16 is formed into a film on the glass substrate 20. Then, the elements 16a are formed by etching the second stripe electrode 16 into stripes so as to have desired pixel pitches and the pixel widths. Next, a p-type a-Si film is deposited on the elements 16a formed by etching and then the p-type a-Si film is etched so as to face the elements 16a and to constitute desired pixel pitches and pixel widths along the longitudinal directions of the elements 16a (that is, so as to correspond to the pixel positions), thus forming the pixel-partitioned p-type a-Si layer 14a. Then, the ia-Si layer 14b is formed into a film as the insulator on the pixel-partitioned p-type a-Si layer 14a. Next, an n-type a-Si film is deposited on the ia-Si layer 14b and then the n-type a-Si film is etched so as to face the elements 16a and to constitute desired pixel pitches and pixel widths along the longitudinal directions of the elements 16a (that is, so as to correspond to the pixel positions), thus forming the pixel-partitioned n-type a-Si layer 14c. Then, another electrode material to constitute the microplates 18 is formed into a film on the pixel-partitioned n-type a-Si layer 14c, and the microplates 18 are partitioned into pixels by etching so as to correspond to the pixel-partitioned n-type a-Si layer 14c, whereby the respective microplates 18 are set to floating states.

In this way, the p-type a-Si layer 14a and the n-type a-Si layer 14c, which collectively constitute the second rectifying layer 14, are partitioned into pixels so as to correspond to the pixel positions. As a consequence, charge transfer does not occur among the elements 16a or among the microplates 18.

Next, the n-type a-Si layer 13a to constitute the first rectifying layer 13 is formed into a film on the microplates 18 and then the n-type a-Si layer 13a is partitioned into pixels by etching so as to face the pixel-partitioned microplates 18. Thereafter, the ia-Si layer 13b is formed into a film as the insulator on the pixel-partitioned n-type a-Si layer 13a. Next, a p-type a-Si film is deposited on the ia-Si layer 13a and then the p-type a-Si film is partitioned into pixels by etching so as to face the positions of arrangement of the pixel-partitioned n-type a-Si layer 13a, thus forming the pixel-partitioned p-type a-Si layer 13c. Subsequently, another electrode material to constitute the first stripe electrode 12 is formed into film on the pixel-partitioned p-type a-Si layer 13c. Lastly, the first stripe electrode 12 is etched into stripes so as to face the positions of arrangement of the pixel-partitioned p-type a-Si layer 13c as well as to intersect the elements 16a, thus forming the elements 12a.

Figure 3:
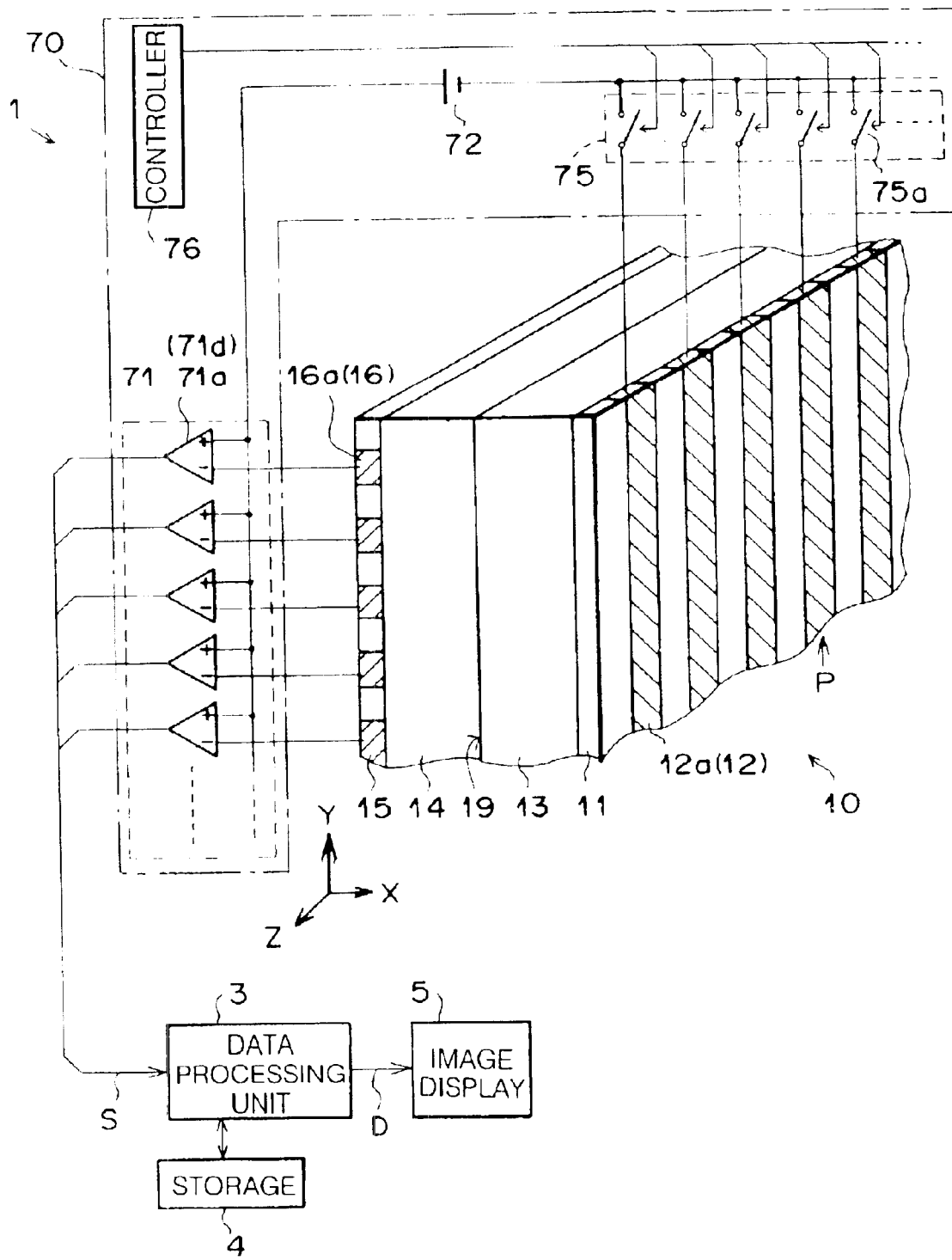
FIG. 3 is a schematic block diagram of a recording and retrieving apparatus using the above-mentioned solid state radiation detector, which is associated with a perspective view of the detector.
Figure 4:
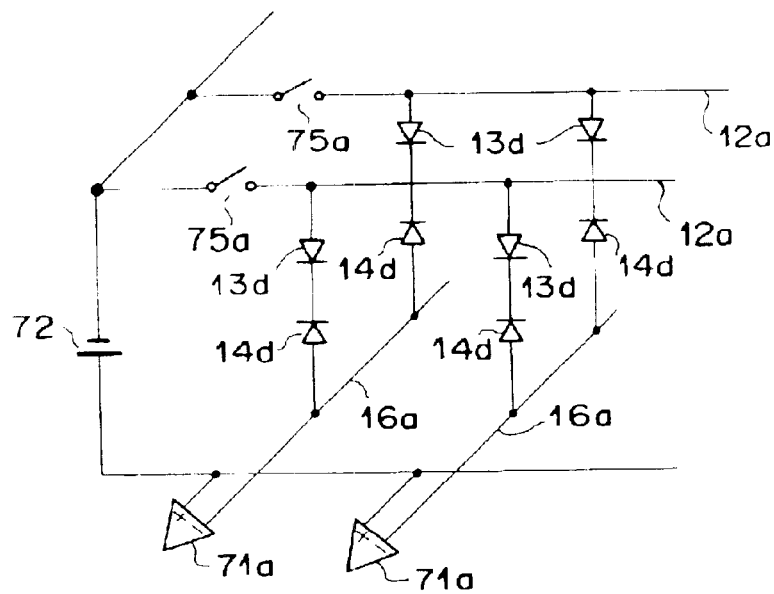
FIG. 4 is a schematic circuit diagram of the recording and retrieving apparatus with illustration of the solid state radiation detector by equivalent circuits.

FIG. 3 and FIG. 4 are views showing a schematic constitution of a recording and retrieving apparatus 1 using the above-described detector 10, which incorporates an image information recording (capturing) apparatus and an image information retrieving apparatus. FIG. 3 is a view associated with a perspective view of the detector 10, and FIG. 4 is a schematic circuit diagram of the recording and retrieving apparatus 1 with illustration of the detector 10 by equivalent circuits. Note that the glass substrate 20 is omitted therein. In FIG. 4, the photodiodes 13d are formed between the microplates 18 and the elements 12a, and the photodiodes 13d includes capacitors Ca which can accumulate electric charges. Such a recording and retrieving apparatus 1 may be used as a sensor for a film digitizer, for example.

A current detection circuit 70 includes a current detection amplifier unit 71 as image signal obtaining means for detecting a charged current flowing into the detector 10, a power source 27, a switch unit 75 having multiple switching elements 75a to be connected to the respective elements 12a of the first stripe electrode 12, and controlling means 76. It is preferred that the switching element 75a has sufficient off resistance. Therefore, a MOS-FET is used for the switching element 75a, for example.

The current detection amplifier unit 71 includes multiple operating amplifiers 71a, which constitute principal part of the current detection amplifier unit 71. A noninverting input terminal (+) of each operating amplifier 71a is connected to a positive electrode of the power source 72, and an inverting input terminal (−) thereof is individually connected to each element 16a. A negative electrode of the power source 72 is connected to one of terminals of each switching element 75a in common.

The power source 72 and the switch unit 75 collectively constitute recording voltage applying means of the present invention for accumulating almost uniform electric charges on the capacitor 19 by applying a given voltage between the first stripe electrode 12 and the second stripe electrode 16.

Upon retrieval, the switch unit 75 switches the respective elements 12a of the first stripe electrode 12 serially in the longitudinal direction of the elements 16a, so that each of the switched elements 12a is connected to the elements 16a of the second stripe electrode 16 via the power source 72 and the imaginary short of the operating amplifiers 71a. A serial switching operation by the switch unit 75 in the longitudinal direction of the elements 16a corresponds to sub-scanning. The charged currents flowing into each element 12a of the first stripe electrode 12 of the detector 10 by the above-described connection switched with the switch unit 75 are detected simultaneously (in parallel) by the operating amplifiers 71a, thereby obtaining electric signals at levels corresponding to amounts of the electric charges accumulated in the capacitor 19. In other words, the power source 72 and the switch unit 75 also constitute retrieving voltage applying means for applying a given voltage between each element 12a of the first stripe electrode 12 and the elements 16a of the second stripe electrode 16.

An output signal S from the current detection circuit 70 is inputted to a data processing unit 3 and then the output signal S is stored in a storage device 4. Thereafter, certain image processing is carried out and data D after the processing are inputted to image displaying means 5, whereby the image displaying means 5 displays a visual image which represents the image information.

In the following, description will be made regarding a series of methods of accumulating the uniform electric charges in the capacitor 19 of the detector 10, recording the image information as an electrostatic latent image, and retrieving the recorded electrostatic latent image by use of the recording and retrieving apparatus 1 of the above-described constitution.

Figure 5A:
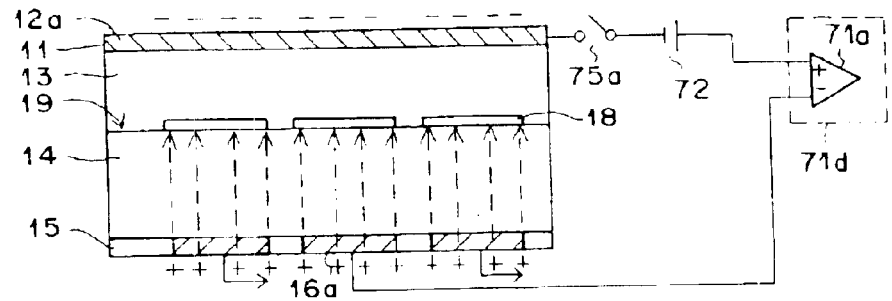
Figure 5B:
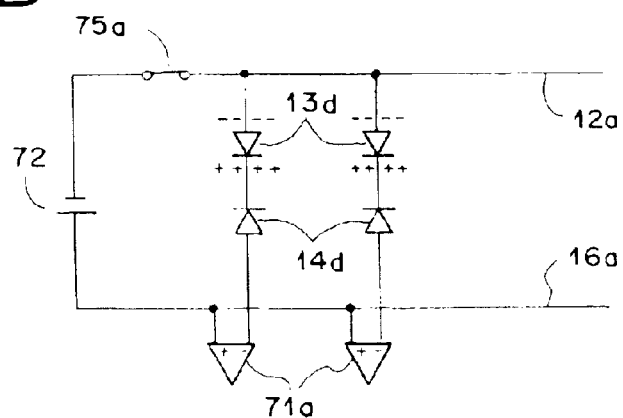

First, description will be made regarding a uniform electric charge accumulation process to accumulate the uniform electric charges in the capacitor 19, with reference to a charge model shown in FIG. 5A. Meanwhile, FIG. 5B is an equivalent circuit diagram of the relevant process. In each of the drawings, illustrations of the glass substrate 20 and the layer constitutions inside the first and the second rectifying layers 13 and 14 are omitted.

In the event of accumulating the uniform electric charges in the capacitor 19 of the detector 10, all the switching elements 75a of the switch unit 75 are turned on to begin with. Then, a direct-current voltage is applied between the first stripe electrode 12 and the second stripe electrode 16 from the power source 72 via the operating amplifiers 71a, such that the second stripe electrode 16 is set as a positive electrode.

In this way, given electric field distribution is generated between the elements 12a and the elements 16a. The electric field is applied to the photodiodes 13d formed between the elements 12a and the microplates 18 and to the diodes 14d formed between the elements 16a and the microplates 18. In this event, the voltage is applied so that the second stripe electrode 16 is set positive and the elements 12a are set negative. Accordingly, the diodes 14d are normally biased and thereby turned on, whereby positive electric charges on the elements 16a are transmitted through the diodes 14d and transferred to the microplates 18. In the meantime, the photodiodes 13d are reversely biased, so that no charge transfer takes place. Therefore, all the elements 12a of the first stripe electrode 12 are negatively charged; meanwhile, the microplates 18 are positively charged. Eventually, a voltage is generated between each microplate 18 and each element 12a, which is almost as large as the voltage applied by the power source 72 (FIG. 5A).

As described above, the image detector according to the present invention does not require a light source as primary charging means for accumulating uniform electric charges in the capacitor. Therefore, it is possible to constitute a simplified recording apparatus.

Next, description will be made regarding an electrostatic latent image recording process to record the image information as an electrostatic latent image, with reference to electric charge models shown in FIGS. 6A to 6C. Note that negative electric charges (−) and positive electric charges (+) generated inside the first rectifying layer 13 by the recording light L2 are illustrated with circled "−" signs or "+" signs in the accompanying drawings, as similar to the uniform electric charge accumulation process. In addition, illustrations of the glass substrate 20 and the layer constitutions inside the first and the second rectifying layers 13 and 14 are again omitted.

Figure 6A:
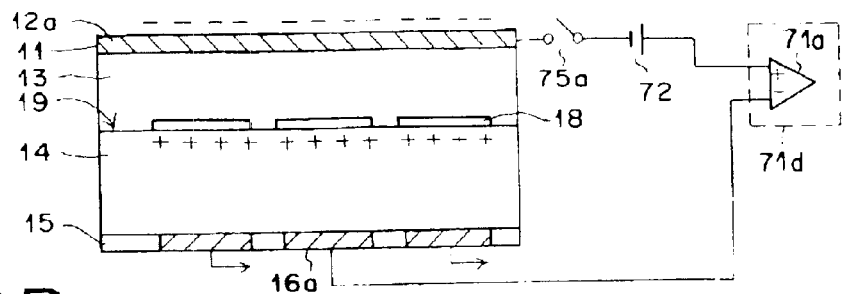

In the event of recording an electrostatic latent image on the detector 10, all the switching elements 75a of the switch unit 75 are turned off to begin with, whereby voltage application from the power source 72 to the detector 10 is discontinued (FIG. 6A).

Next, visible light L1 is irradiated on a film 9 which records image information of an imaging object, and the recording light L2 transmitted through a transmissive portion 9a, which carries the image information of the imaging object, is irradiated on the first electrode layer 11 of the detector 10. In the case of irradiating the recording light L2 from the first electrode layer 11 side, the first stripe electrode 12 should have transmittance with respect to the recording light L2.

Figure 6B:
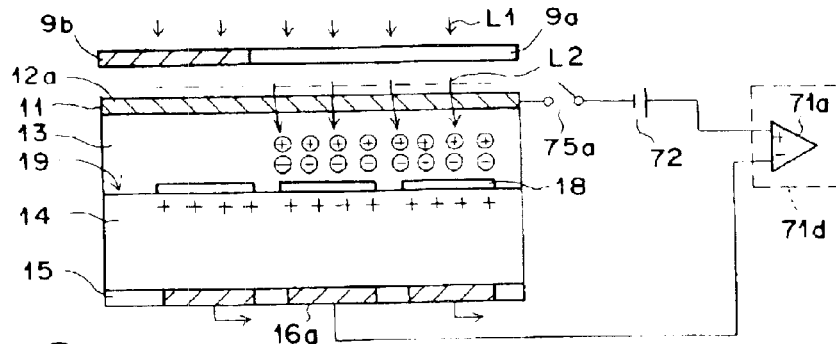
Figure 6C:
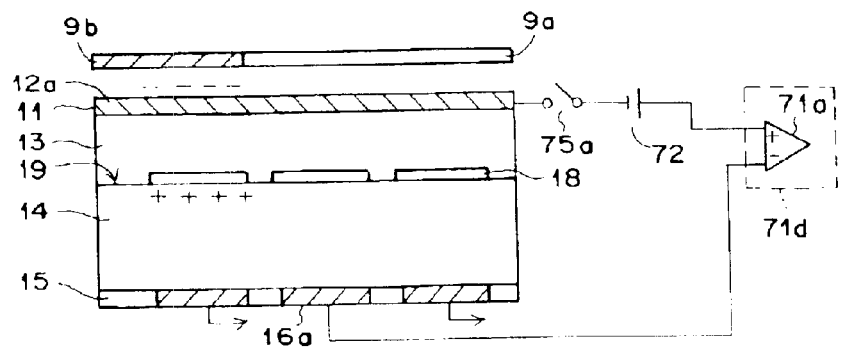
Figure 6D:
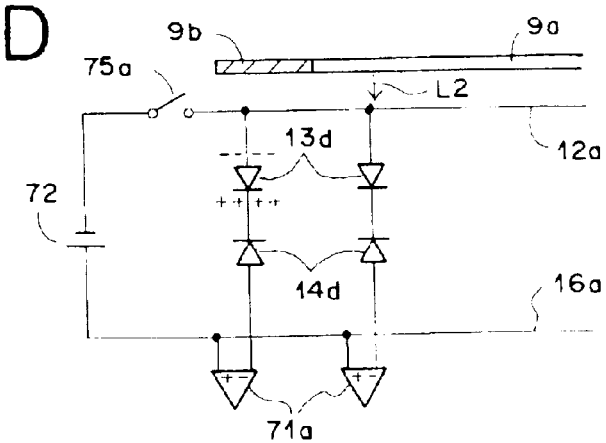

The recording light L2 passes through the first electrode layer 11 of the detector 10 and thereby generates positive and negative charge pairs in an amount corresponding to a dosage of the recording light L2 inside the first rectifying layer 13 (FIG. 6B). Negative electric charges charged on the respective elements 12a and uniform positive electric charges caught by and charged on the microplates 18 collectively create given electric field distribution between the first stripe electrode 12 and the capacitor 19. Therefore, according to the electric field distribution, the positive electric charges out of the generated electric pairs move toward the first electrode layer 11 and are recombined with the negative electric charges charged on the elements 12a of the stripe electrode 12, whereby they eventually disappear. Moreover, the negative electric charges move toward the capacitor 19 and are recombined with the positive electric charges charged on the microplates 18, whereby they eventually disappear (as shown at the right side in FIG. 6C).

Meanwhile, the visible light L1 irradiated on a non-transmissive portion 9b of the film 9 does not pass through the non-transmissive portion 9b. Accordingly, the charge pairs are not generated in a region of the first rectifying layer 13 corresponding to the non-transmissive portion 9b. As a result, the negative electric charges remain charged on the relevant element 12a of the first stripe electrode 12 and the positive electric charges remain charged on the relevant microplate 18 because the relevant diode 14d does not transmit an electric current from a cathode to an anode thereof (as shown at the left side in FIG. 6C). Moreover, a state that the positive electric charges are charged on the microplate 18 and the negative electric charges are charged on the element 12a constitutes a reversely biased state with respect to the photodiode 13d of the first rectifying layer 13. Accordingly, it is possible to suppress discharge of the positive electric charges from the microplate 18.

Incidentally, description has been made in the foregoing based on an assumption that the charge pairs were generated in the first rectifying layer 13 sufficiently to annihilate all the electric charges charged on the elements 12a and the microplates 18 of the capacitor 19. However, in reality, a quantity of generated charge pairs corresponds to intensity or the dosage of the recording light L2 incident on the detector 10. Therefore, it is not always possible to generate the charge pairs sufficient for annihilating all the electric charges charged uniformly inside the detector 10 by simple application of a voltage.

In other words, the quantity of electric charge generation is almost proportional to the intensity or a light amount of the recording light L2, which is transmitted through the transmissive portion 9a of the film 9 and made incident on the detector 10. Accordingly, a quantity of the electric charges to remain charged on the detector 10 is calculated by subtracting the amount of the generated electric charges from the amount of the uniform electric charges accumulated in the capacitor 19 by application of the voltage. Therefore, the amount of the positive electric charges in the capacitor 19 vary according to the intensity or the dosage of the recording light L2, and the electrostatic latent image is recorded on the detector 10 in the foregoing manner. Note that the electric charges for a latent image are intensely accumulated in the microplates 18, and it is thereby possible to enhance sharpness upon recording.

Next, description will be made regarding an electrostatic latent image retrieving process to retrieve the electrostatic latent image recorded on the detector, with reference to electric charge models shown in FIGS. 7A to 7C. Note that the negative electric charges (−) and the positive electric charges (+) generated inside the first rectifying layer 13 are illustrated with circled "−" signs or "+" signs in the accompanying drawings, as similar to the uniform electric charge accumulation process and the recording process. In addition, illustrations of the glass substrate 20 and the layer constitutions inside the first and the second rectifying layers 13 and 14 are again omitted.

Figure 7A:
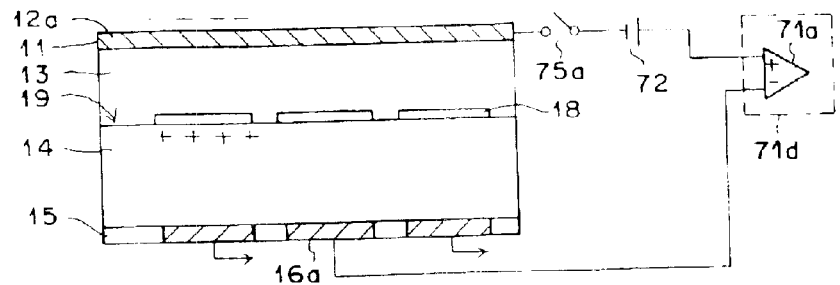
FIGS. 7A to 7C are electric charge models showing a process of retrieving the electrostatic latent image by detecting charged currents in the case of using the solid state radiation detector according to the first embodiment of the present invention.

Upon retrieving the electrostatic latent image out of the detector 10, the detector 10 is adjusted such that a voltage having the same polarity and the same magnitude as the voltage applied to the detector 10 immediately before irradiation of the recording light L2, i.e. the direct-current voltage, is applied between the elements 12a and the elements 16a via imaginary short of the operating amplifiers 71a by the power source 72 when the switching elements 75a of the switch unit 75 are turned on (FIG. 7A).

Figure 7B:
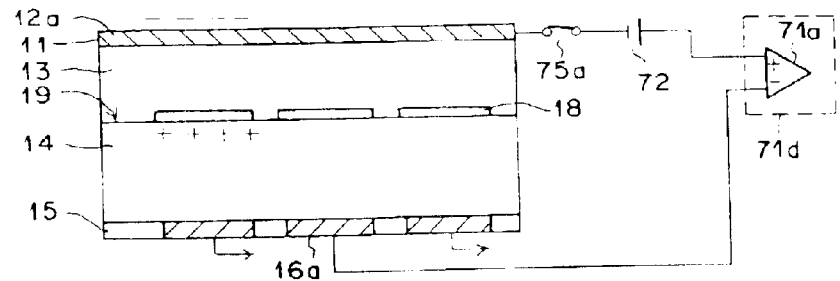

Subsequently, the switching elements 75a of the switch unit 75 are serially switched and turned on from one end to the other end in the longitudinal direction of the elements 16a, and the voltage from the power source 72 is applied between the element 12a connected to the active switching element 75a and the elements 16a of the second stripe electrode 16 (FIG. 7B).

In response to application of the voltage to the detector 10 by serial switching, the element 12a is negatively charged and the relevant microplate 18 is positively charges as similar to the uniform electric charge accumulation process, if the positive electric charges are not accumulated between the element 12a and the relevant microplate 18. On the contrary, in a position where the positive electric charges are accumulated on the microplate 18, a voltage almost the same magnitude as the applied voltage is already generated between the microplate 18 and the relevant element 12a. Therefore, charge transfer does not occur in that position as the relevant diode 14d is not turned on.

Figure 7C:
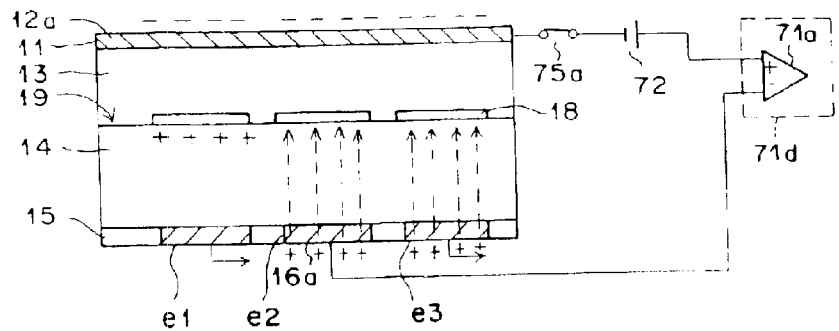
Figure 8A:
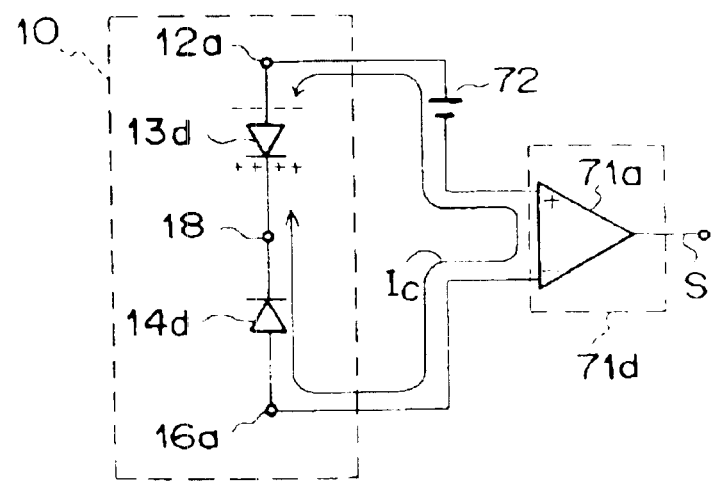
FIG. 8A is a view showing re-distribution of positive electric charges in a case of detecting the charged current.
Figure 8B:
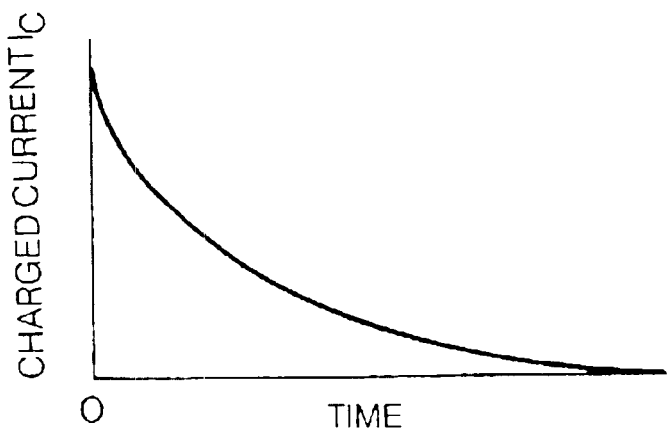
FIG. 8B is a graph showing a variation of the charged current in that case.

For example, in FIG. 7C, charge transfer does not occur in the position where 4 pieces of positive electric charges are accumulated in the microplate 18 corresponding to an element number e1. Meanwhile, 4 pieces of negative electric charges are charged on each of the elements 12a corresponding to the microplates 18 corresponding to element numbers e2 and e3 where without previous accumulation of the positive electric charges. In this event, 4 pieces of positive electric charges will be charged on each of the microplates 18. FIG. 8A is an equivalent circuit diagram showing the aspect of the above-described electrification regarding the element number e2, and FIG. 8B is a graph showing a variation of a charged current Ic associated with the electrification.

The current detection amplifier 71d of the current detection amplifier unit 71 detects charged currents, which flow into the detector 10 due to the charge transfer associated with the electrification, simultaneously regarding the respective elements 16a. Further, the current detection amplifier 71d sequentially detects voltage variations to be observed at an output portion of the current detection amplifier 71d in response to the electric charges for a latent image on the respective pixels by means of serial switching with the switch unit 75. In this way, the current detection amplifier 71d obtains image signals which represent the electrostatic latent image, in other words, it retrieves the image information.

As described above, the image detector according to the present invention does not require a light source as means for retrieving the electric charges for a latent image. Therefore, it is possible to constitute a simplified retrieving apparatus.

Since the diode 14$d$ has a capacity, re-distribution of electric charges takes place so that the elements 12$a$ and the elements 16$a$ have equal electric potentials, respectively. A retrievable signal current, that is, the charged current contributable to the image signal is a re-charged current into the first rectifying layer 13. Therefore, the retrievable signal current varies by an amount equivalent to the electric charges which are distributed to the diode 14$d$. Hence it is preferable to reduce a ratio C1/C2 between the capacity C1 of the diode 14$d$ and a capacity C2 of the first rectifying layer 13 in order to increase the charged current contributable to the image signal. In this regard, it is effective to reduce the capacity ratio by thinning the elements 16$a$ and decreasing an area of the diode 14$d$; alternatively, by reducing the thickness of the first rectifying layer 13 as thin as possible while retaining an adequate light-absorbing performance.

Figure 9A:
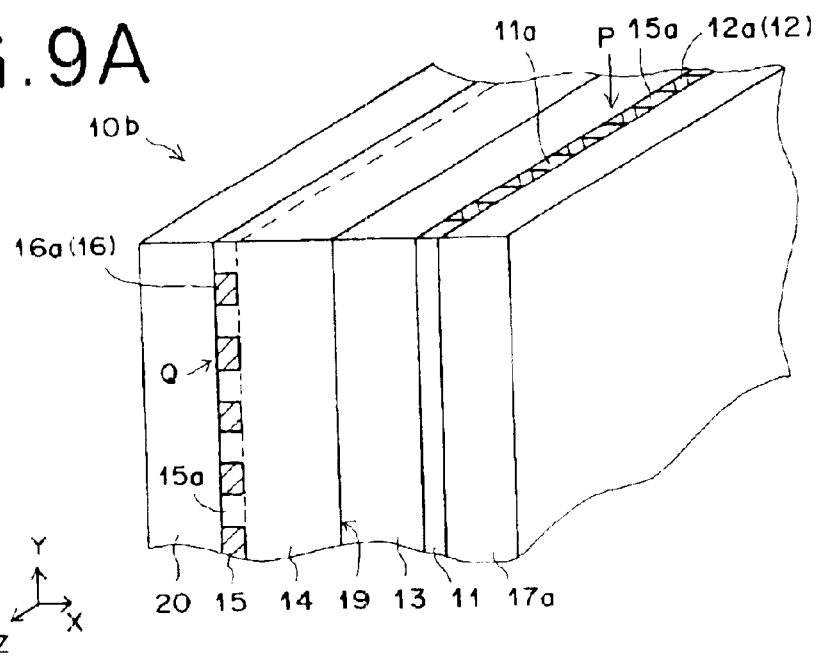
Figure 9B:
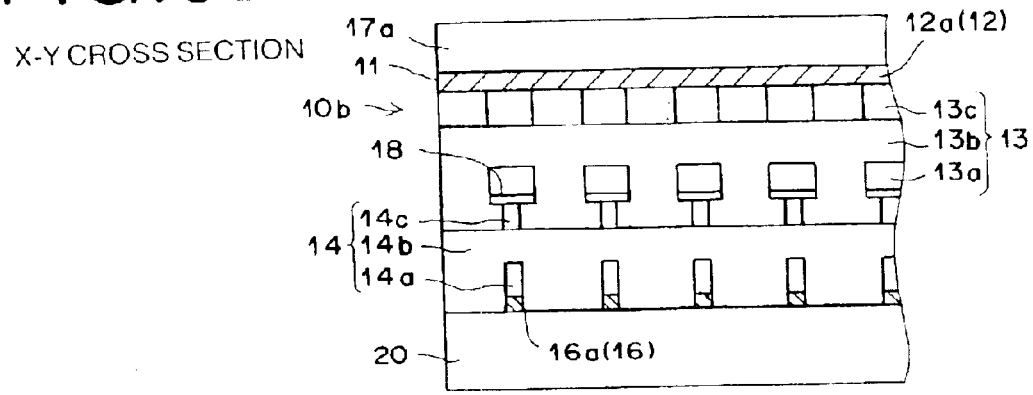
Figure 9C:
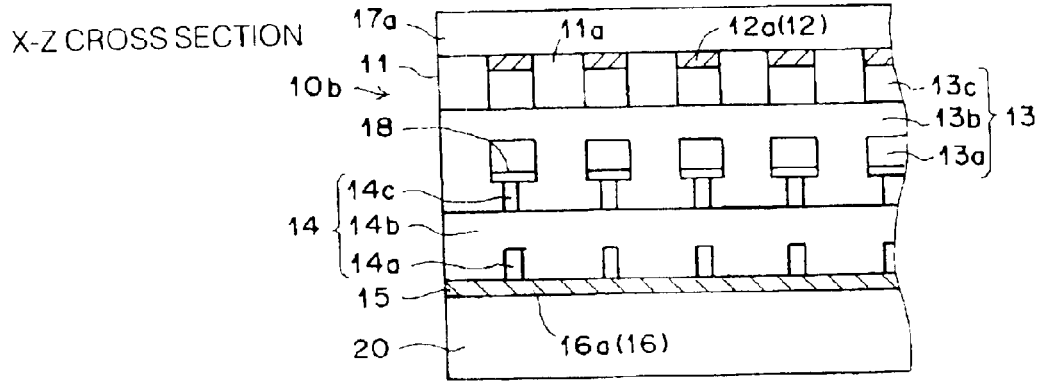

FIGS. 9A to 9C are views showing a schematic constitution of a solid state radiation detector (hereinafter referred to as the detector) adopting a second embodiment of the image detector according to the present invention, in which FIG. 9A is a perspective view thereof, FIG. 9B is an X–Y cross-sectional view in a position indicated with an arrow P in FIG. 9A, and FIG. 9C is an X–Z cross-sectional view in a position indicated with an arrow Q in FIG. 9A.

In the detector 10$b$ of this embodiment, first and second rectifying layers 13 and 14 are composed of members containing a-Si as the main ingredient thereof as similar to the detector 10 according to the first embodiment. In addition, as shown in the drawings, p-type a-Si layers 13$c$ and 14$a$, and n-type a-Si layers 13$a$ and 14$c$ to constitute the first and second rectifying layers 13 and 14 are partitioned into pixels so as to correspond to pixel positions.

Figure 10:
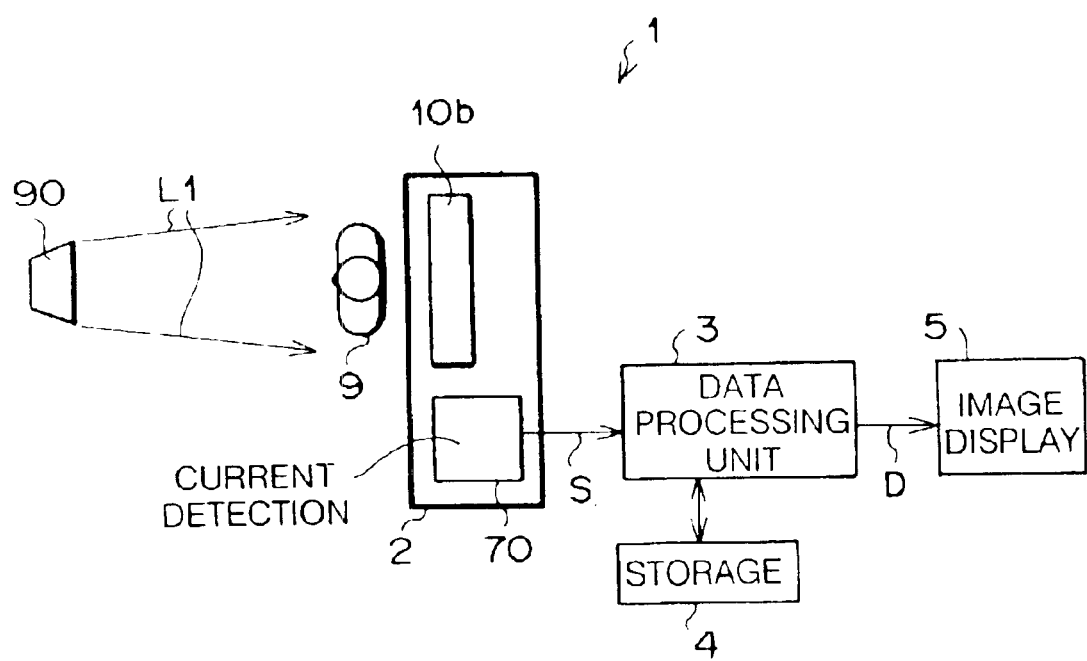
FIG. 10 is a view showing an entire constitution of the recording and retrieving apparatus.

FIG. 10 is a view showing an entire constitution of a recording and retrieving apparatus 1 using the detector 10$b$ according to this embodiment. In the first embodiment, a subject of irradiation of the visible light L1 is the film 9 which records the image information of the imaging object in advance. However, in the second embodiment, an imaging object 9 is exposed directly to a radiation L1 from a radiation source 90, whereby a recording light L2, which passes through a transmissive portion 9$a$ of the imaging object 9 and thereby carries radiation image information regarding the imaging object 9, is irradiated on the detector 10$b$. The detector 10$b$ and a current detection circuit 70 are housed inside a light-shielding case 2. An output signal S from the current detection circuit 70 is inputted to a data processing unit 3 and then the output signal S is stored in a storage device 4. Thereafter, certain image processing is carried out and data D after the processing are inputted to image displaying means 5, whereby the image displaying means 5 displays a visual image which represents the radiation image information.

In the detector 10$b$ according to the second embodiment, a fluorescent material (a scintillator) 17$a$ is stacked on an outside of a first electrode layer 11 of the detector 10 according to the first embodiment, as a wavelength converting layer for emitting fluorescent light L4 to be caused by excitation of the recording light L2, in which the fluorescent light L4 has a different wavelength from the wavelength of the recording light L2. Moreover, the first electrode layer 11 has transmittance with respect to the fluorescent light L4, and the first rectifying layer 13 takes on conductivity by receiving irradiation of the fluorescent light L4 which is emitted from the fluorescent material 17$a$.

A fluorescent material having high wavelength conversion efficiency with respect to the recording light L2 is preferred for use in the fluorescent material 17$a$. For example, if the first rectifying layer 13 is composed of a member containing a-Si as the main ingredient, then the first rectifying layer 13 exerts highly efficient conductivity upon irradiation of green light. Therefore, it is preferable to use a fluorescent material containing GOS, CsI:Tl or the like as a main ingredient, so that the fluorescent material 17$a$ emits the green light.

Now, description will be made regarding an electrostatic latent image recording process by use of the detector 10$b$ according to the embodiment, with reference to electric charge models shown in FIGS. 11A to 12D. Again, negative electric charges (−) and positive electric charges (+) generated inside the first rectifying layer 13 by the fluorescent light L4 excited and emitted by the recording light L2 are illustrated with circled "−" signs or "+" signs in the accompanying drawings, as similar to the corresponding case of using the detector 10 in the first embodiment. Note that a uniform electric charge accumulation process for charging uniform electric charges by application of a voltage, and an electrostatic latent image retrieving process are similar to the relevant processes in the case of using the detector 10 according to the first embodiment. Therefore, description regarding those processes will be omitted herein. In addition, illustrations of a glass substrate 20 and layer constitutions inside first and second rectifying layers 13 and 14 are also omitted.

To begin with, description will be made regarding the electrostatic latent image recording process in the case of irradiating the recording light L2 from the first electrode layer 11 side, i.e. from the fluorescent material 17$a$ side, with reference to FIGS. 11A to 11D.

Figure 11A:
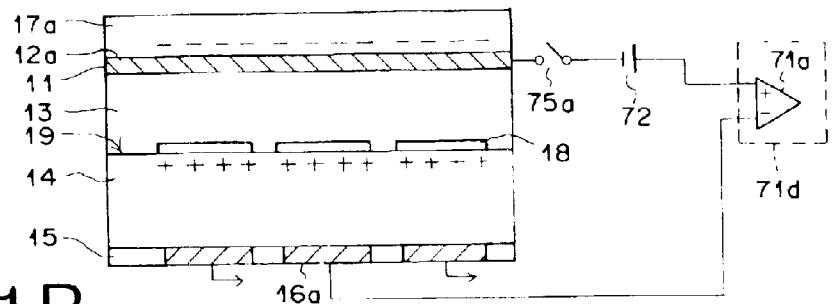
FIGS. 11A to 11D are electric charge models showing a process of recording the electrostatic latent image by irradiating recording light from a fluorescent material side in a case of using the solid state radiation detector according to the second embodiment.
Figure 11B:
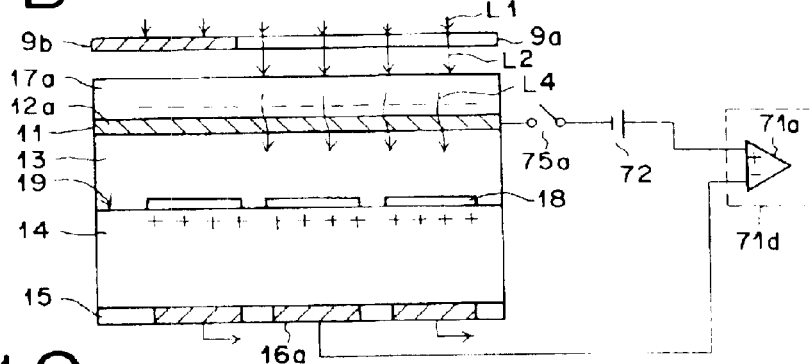
Figure 11C:
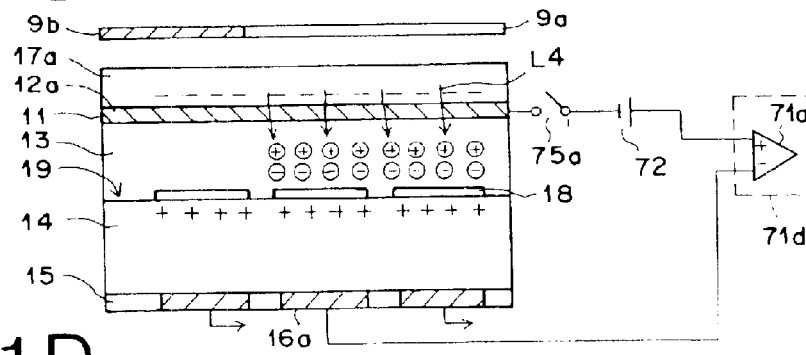
Figure 11D:
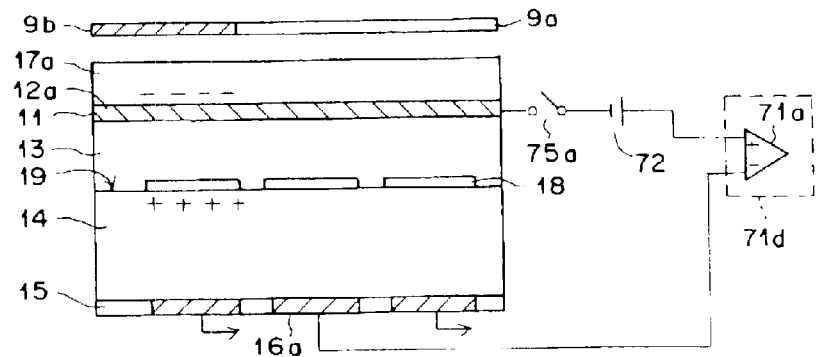

In a state of uniform electric charge accumulation as shown in FIG. 11A, application of a voltage to the detector 10$b$ is discontinued and the imaging object 9 is exposed to the radiation L1. Accordingly, the recording light L2, which passes through the transmissive portion 9$a$ of the imaging object 9 and thereby carries the radiation image information of the imaging object, is irradiated on the fluorescent material 17$a$ of the detector 10$b$. In this way, the fluorescent light L4 in an amount corresponding to a dosage of the recording light L2 is emitted out of the fluorescent material 17$a$ by excitation of the recording light L2 (FIG. 11B). The fluorescent light L4, which is emitted out of the fluorescent material 17$a$, passes through the first electrode layer 11, and then generates positive and negative charge pairs inside the first rectifying layer 13 in an amount corresponding to the amount of the fluorescent light L4 (FIG. 11C).

As similar to the case of using the detector 10 according to the first embodiment, positive electric charges out of the generated charge pairs move toward the first electrode layer 11 and are recombined with the negative electric charges charged on elements 12$a$ of a stripe electrode 12, whereby they eventually disappear. Moreover, the negative electric charges move toward a capacitor 19 and are recombined with the positive electric charges charged on microplates 18, whereby they eventually disappear (as shown at the right side of the detector 10$b$ in FIG. 11D).

Meanwhile, the radiation irradiated on a non-transmissive portion 9$b$ of the imaging object 9 does not pass through the imaging object 9. Accordingly, the fluorescent light L4 is not emitted from a portion of the fluorescent material 17$a$ corresponding to the non-transmissive portion 9b. As a result, the negative electric charges remain charged on the relevant element 12a of the first stripe electrode 12 and the positive electric charges remain charged on the relevant microplate 18 (as shown at the left side of the detector 10b in FIG. 11C).

In short, whereas the charge pairs are generated inside the first rectifying layer 13 in the detector 10 according to the first embodiment because the first rectifying layer 13 receives irradiation of the recording light L2 directly, the detector 10b according to the second embodiment is just different from the first embodiment in a point that the charge pairs are generated inside the first rectifying layer 13 by receiving irradiation of the fluorescent light L4. In other words, the difference in the process of recording the electrostatic latent image on the detector 10 (10b) between the first embodiment and the second embodiment is not anything larger than a difference between the recording light L2 and the fluorescent light L4.

Figure 12A:
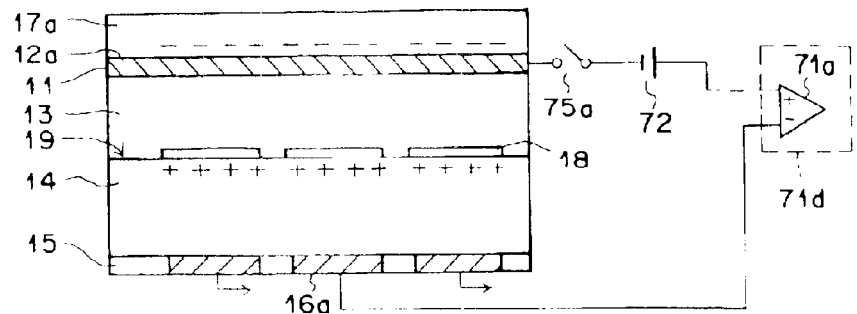
FIGS. 12A to 12D are electric charge models showing a process of recording the electrostatic latent image by irradiating recording light from a second electrode layer side in the case of using the solid state radiation detector according to the second embodiment.

Next, description will be made regarding the case of irradiating the recording light L2 from the second electrode layer 15 side with reference to FIGS. 12A to 12D. FIG. 12A is identical to FIG. 11A. Note that the first and the second rectifying layers 13 and 14, and the microplates 18 have transmittance with respect to the recording light L2 at the minimum.

Figure 12B:
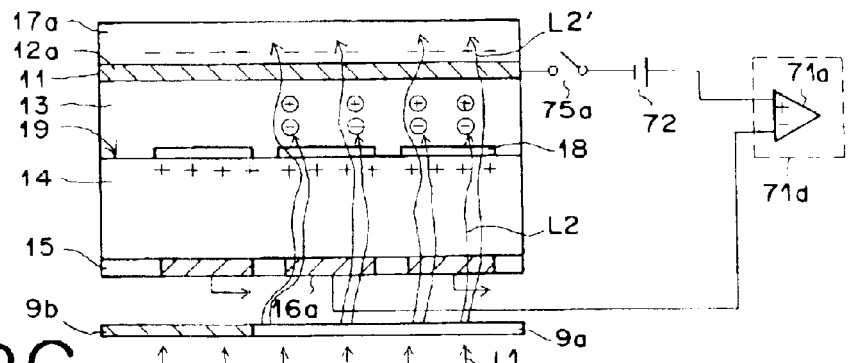

In the state of electric charge accumulation as shown in FIG. 12A, application of the voltage to the detector 10b is discontinued and the imaging object 9 is exposed to the radiation, whereby the recording light L2, which passes through the transmissive portion 9a of the imaging object 9, is irradiated on the second electrode layer 15 of the detector 10b. The recording light L2 passes through the second electrode layer 15 and the second rectifying layer 14, and then generates positive and negative charge pairs inside the first rectifying layer 13 in an amount corresponding to the amount of the recording light L2 (FIG. 12B).

Figure 12C:
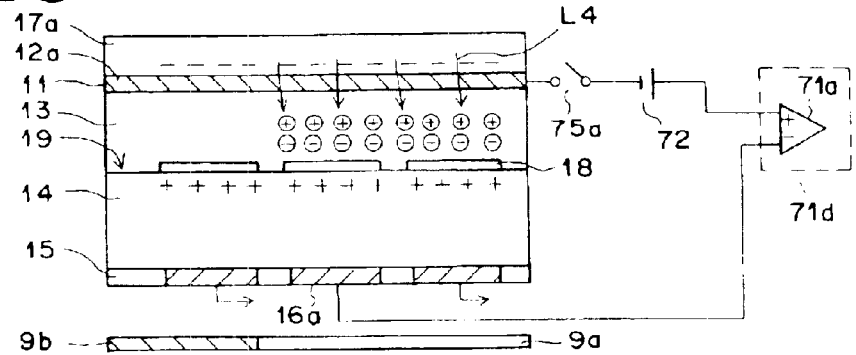
Figure 12D:
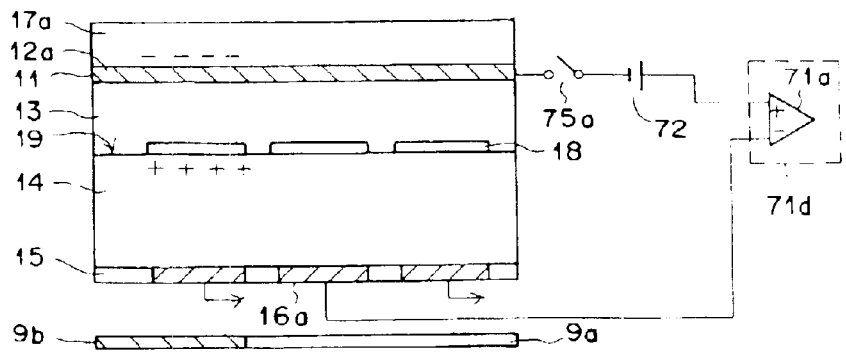

Moreover, the recording light L2' which passed through the first rectifying layer 13 further passes through the first electrode layer 11, whereby the recording light L2' is made incident on the fluorescent material 17a. Accordingly, the fluorescent light L4 in an amount corresponding to a dosage of the recording light L2' is emitted out of the fluorescent material 17a by excitation of the recording light L2'. The fluorescent light L4 emitted out of the fluorescent material 17a passes through the first electrode layer 11 and generates positive and negative charge pairs inside the first rectifying layer 13 in an amount corresponding to the dosage of the fluorescent light L4 (FIG. 12C). Thereafter, similar actions to the above-described case of irradiating the recording light L2 from the fluorescent material 17a side take place, whereby the electric charges on the elements 12a and the capacitor 19 disappear (FIG. 12D).

By use of the detector 10b with the fluorescent material 17a stacked thereon in the above-described manner, it is possible to generate the positive and negative charge pairs inside the first rectifying layer 13 very efficiently not only by the recording light L2 but also by the wavelength-converted fluorescent light L4. Therefore, whereas some of the recording light L2 did not contribute to accumulation of the electric charges for a latent image but just passed through the first rectifying layer 13 when the detector 10 according to the first embodiment was used, the detector 10b of the second embodiment can enhance efficiency of electric charge generation relatively.

Moreover, in the case of irradiating the recording light L2 from the second electrode layer 15 side, efficiency of electric charge generation is enhanced more than the case of irradiating the recording light L2 from the fluorescent material 17a side, because a radiation incident side of the fluorescent material 17a with a large radiation absorbing capacity is situated adjacent to the first rectifying layer 13. In other words, the order of arrangement as the radiation source 90, the first rectifying layer 13 and the fluorescent material 17a is superior to the order of arrangement as the radiation source 90, the fluorescent material 17a and the first rectifying layer 13, in terms of efficiency of electric charge generation. In addition, the former order is also superior in terms of an S/N ratio upon retrieval.

Furthermore, a radiation absorbing rate can be enhanced if the fluorescent material adopts cesium iodide in particular. In this way, it is possible to accumulate sufficient electric charges even if the dosage of the recording light L2 is reduced, thereby effectuating reduction of the radiation dosage with respect to the imaging object 9.

Whereas the detector 10b according to the second embodiment includes the fluorescent material 17a being stacked on the outside of the first electrode layer 11, the detector 10b may also adopt a structure of including the fluorescent material on the outside of the second electrode layer 15.

Figure 13A:
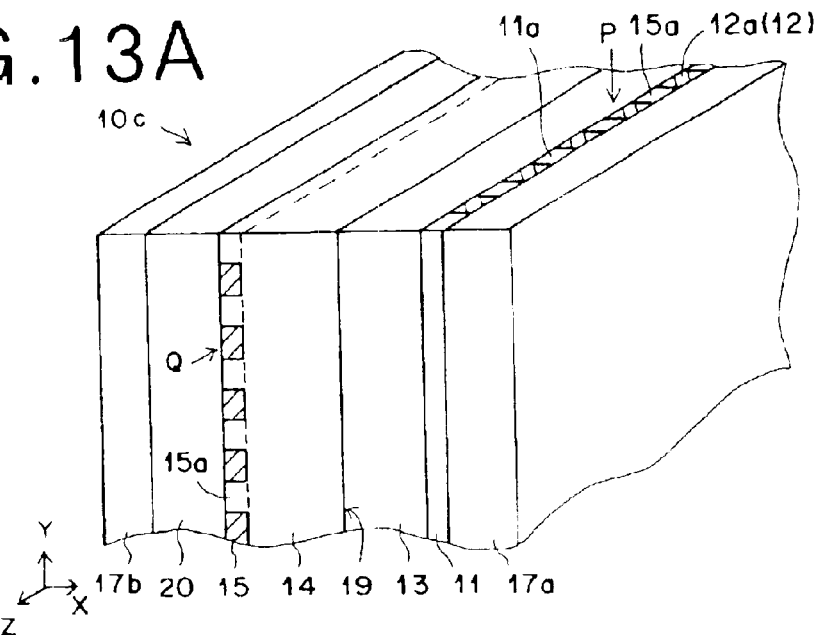
Figure 13B:
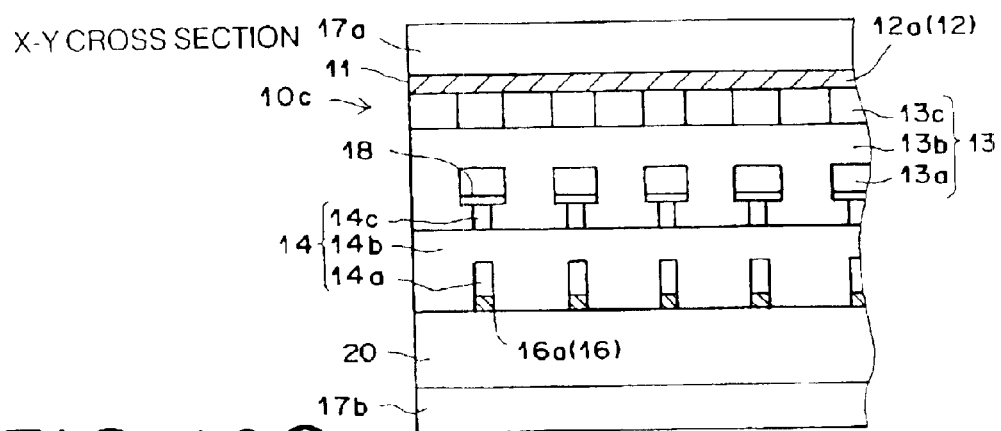
Figure 13C:
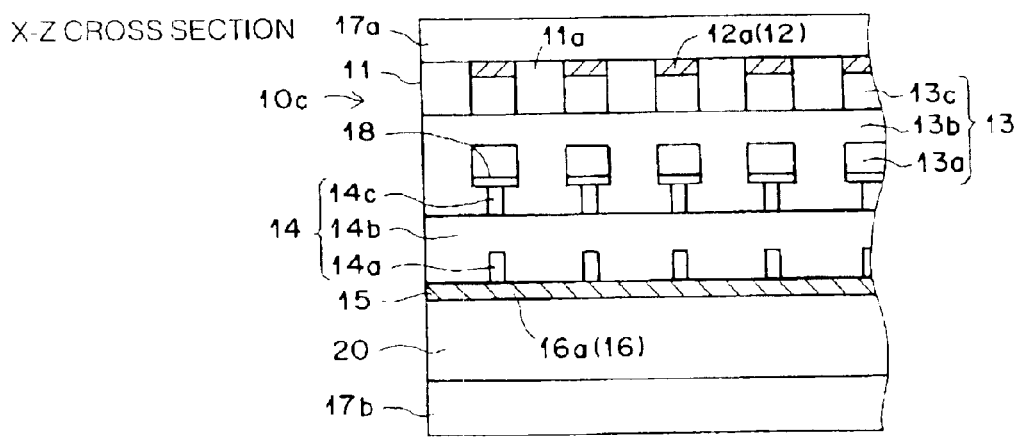

FIGS. 13A to 13C are views showing a schematic constitution of a solid state radiation detector adopting a third embodiment of the image detector according to the present invention, in which FIG. 13A is a perspective view thereof, FIG. 13B is an X–Y cross-sectional view in a position indicated with an arrow P in FIG. 13A, and FIG. 13C is an X–Z cross-sectional view in a position indicated with an arrow Q in FIG. 13A.

A detector 10c according to this embodiment has a constitution that, another fluorescent material 17b for emitting fluorescent light L5 with a different wavelength from the wavelength of the recording light L2' by excitation of the recording light L2' transmitted through the first rectifying layer 13 is additionally stacked on the outside of the second electrode layer 15 of the detector 10b according to the above-mentioned second embodiment. Here, the second rectifying layer 14 and the second electrode layer 15 of the third embodiment have transmittance with respect to the fluorescent light L5, and the first rectifying layer 13 thereof takes on conductivity by receiving irradiation of the fluorescent light L4 emitted from the fluorescent material 17a and irradiation of the fluorescent light L5 emitted from the fluorescent material 17b.

In order to provide the second rectifying layer 14 with the transmittance with respect to the fluorescent light L5, carbon-doped amorphous silicon a-SiC or nitrogen-doped amorphous silicon a-SiN may be used as a material for forming the p-type a-Si layer 14a, the ia-Si layer 14b and the n-type a-Si layer 14c, which collectively constitute the second rectifying layer 14. Doping carbon C or nitrogen N into a-Si effectuates an increase in band gaps. Accordingly, it is possible to form the second rectifying layer 14 so as to have large absorption capability on a short-wave side and to have transmittance with respect to green fluorescent light, which belongs to a relatively long-wave side. Note that the doping agent is not particularly limited to carbon C and nitrogen N therein, but any other known doping agents may be used if such doping agents can increase band gaps so as to enhance absorption on the short-wave side.

Moreover, upon transformation of the a-SiC or a-SiN, boron B may be slightly doped to form the p-type and phosphorous P may be slightly doped to form the n-type.

Figure 14A:
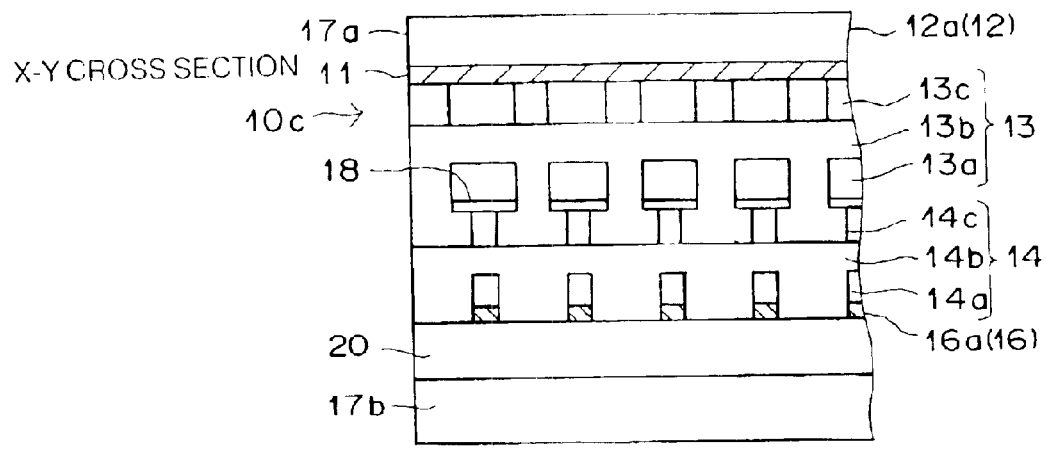
FIGS. 14A and 14B are views showing a modified aspect of the solid state radiation detector according to the third embodiment.
Figure 14B:
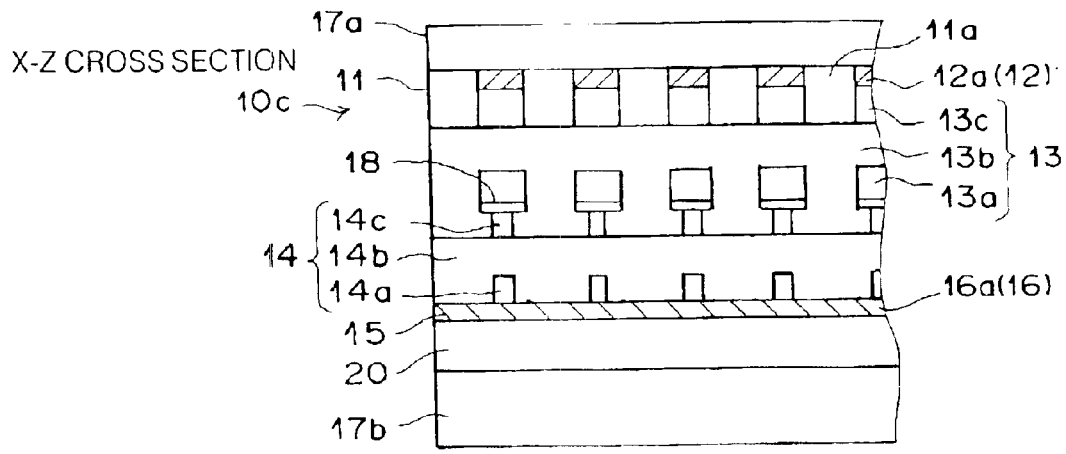

Meanwhile, as shown in FIGS. 14A and 14B, each diode 14d of the second rectifying layer 14 maybe formed into a size smaller than about ⅔ of the minimum resolvable pixel size by means of etching, and gaps among the respective diodes 14d may be filled with a material having transmittance with respect to the fluorescent light L5 emitted from the fluorescent material 17b.

Note that the mode of providing the second rectifying layer 14 with transmittance with respect to the fluorescent light L5 is also applicable as a mode of providing the second rectifying layer 14 with transmittance with respect to the recording light L2.

The microplates 18 are preferred to have transmittance with respect to the fluorescent light L5 emitted from the fluorescent material 17b at the minimum. For the microplates 18, it is preferred to use publicly-known transparent conductive films such as ITO films.

As the material for the first rectifying layer 13, preferred is a material containing a-Si as a main ingredient, which takes on conductivity very efficiently with respect to the green light emitted from the fluorescent materials 17a and 17b. Moreover, it is preferable to set the thickness of the first rectifying layer 13 to a thickness appropriate for absorbing sufficient fluorescent light L4 and L5.

As the material for the fluorescent materials 17a and 17b, it is preferred to use a fluorescent material having high wavelength conversion efficiency. Therefore, in the case of forming the first rectifying layer 13 with a member containing a-Si as the main ingredient thereof as described above, it is preferable to use a fluorescent material containing GOS, CsI:Tl or the like as the main ingredient thereof, so that the fluorescent materials 17a and 17b can emit green light.

Now, description will be made regarding an electrostatic latent image recording process by use of the detector 10c according to the embodiment, with reference to electric charge models shown in FIGS. 15A to 16D. Again, negative electric charges (−) and positive electric charges (+) generated inside the first rectifying layer 13 by the fluorescent light L4 excited and emitted by the recording light L2 are illustrated with circled "−" signs or "+" signs in the accompanying drawings, as similar to the corresponding case of using the detector 10 in the first embodiment. Throughout FIGS. 15A to 16D, illustrations of a glass substrate 20 and layer constitutions inside first and second rectifying layers 13 and 14 are omitted. Moreover, it should be noted that a uniform electric charge accumulation process for charging uniform electric charges by application of a voltage, and an electrostatic latent image retrieving process are similar to the relevant processes in the case of using the detector 10 according to the first embodiment. Therefore, description regarding those processes will be omitted herein.

Figure 15A:
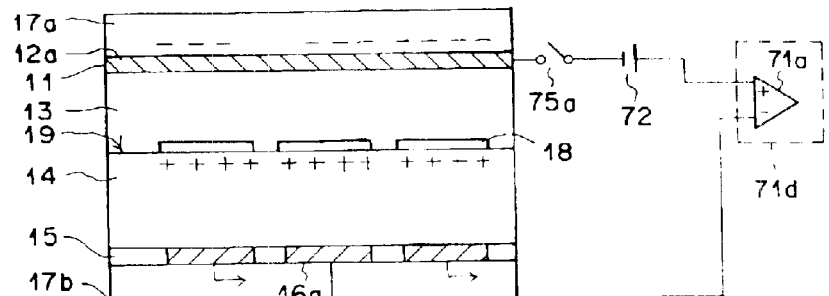
FIGS. 15A to 15D are electric charge models showing a process of recording the electrostatic latent image in a case of using the solid state radiation detector according to the third embodiment.

In a state of uniform electric charge accumulation as shown in FIG. 15A, application of a voltage to the detector 10c is discontinued and an imaging object 9 is exposed to a radiation. Accordingly, the recording light L2, which passes through a transmissive portion 9a of the imaging object 9, is irradiated on the fluorescent material 17a of the detector 10c.

Figure 15B:
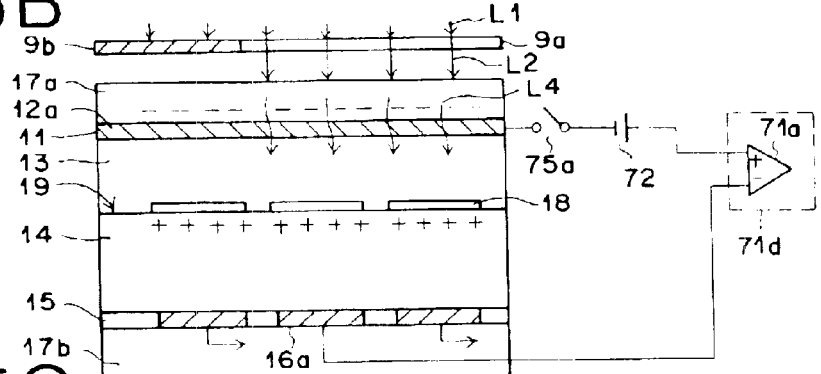
Figure 15C:
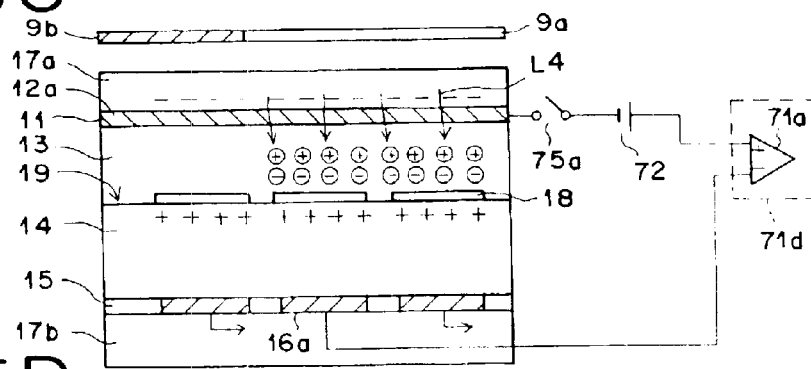
Figure 15D:
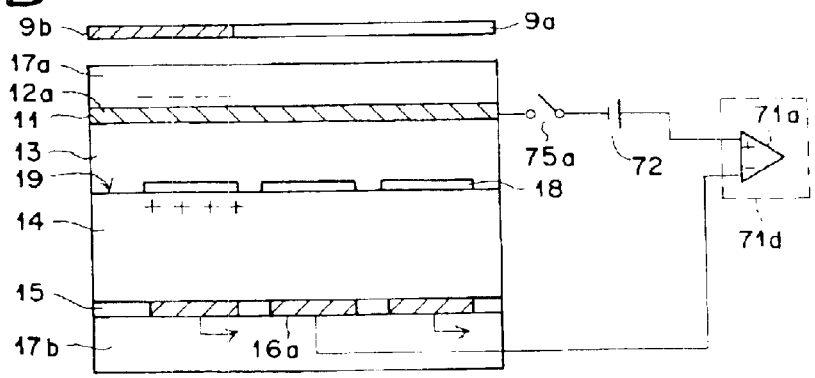

In this way, the fluorescent light L4 in an amount corresponding to a dosage of the recording light L2 is emitted out of the fluorescent material 17a by excitation of the recording light L2 (FIG. 15B). The fluorescent light L4 passes through the first electrode layer 11, and then generates positive and negative charge pairs inside the first rectifying layer 13 in an amount corresponding to the amount of the fluorescent light L4 (FIG. 15C). Positive electric charges out of the generated charge pairs move toward the first electrode layer 11 and are recombined with the negative electric charges charged on elements 12a of a stripe electrode 12, whereby they eventually disappear. Moreover, the negative electric charges move toward a capacitor 19 and are recombined with the positive electric charges charged on microplates 18, whereby they eventually disappear (as shown at the right side of the detector 10c in FIG. 15D). Meanwhile, in a region opposite to a non-transmissive portion 9b of the imaging object 9, the negative electric charges remain charged on the relevant element 12a and the positive electric charges remain charged on the relevant microplate 18 (as shown at the left side of the detector 10c in FIG. 15D). In short, the above-described aspects are so far identical to the process of recording the electrostatic latent image on the detector 10b according to the second embodiment by means of irradiating the recording light L2 onto the fluorescent material 17a.

Figure 16A:
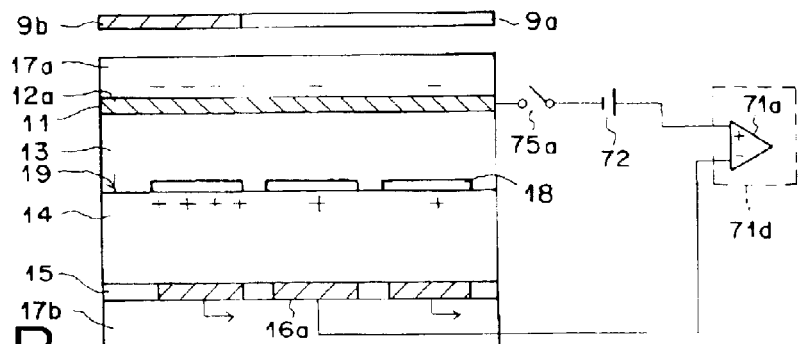
FIGS. 16A to 16D are electric charge models showing the process of recording the electrostatic latent image, which are subsequent to the FIG. 15D.

Incidentally, description has been made in the foregoing based on an assumption that the charge pairs were generated in the first rectifying layer 13 sufficiently to annihilate all the electric charges charged on the elements 12a and the microplates 18 of the capacitor 19. However, in reality, a quantity of generated charge pairs corresponds to intensity or the dosage of the recording light L2 incident on the detector 10c. Moreover, even if the intensity and the dosage are constant, the quantity of generated charge pairs may vary in accordance with conversion efficiency of the fluorescent material 17a and efficiency of electric charge generation by the first rectifying layer 13. In other words, it is not always possible to generate the charge pairs sufficient for annihilating all the electric charges charged uniformly inside the detector 10c. As a result, some electric charges may also remain charged on the elements 12a and the microplates 18 of the capacitor 19 in the region corresponding to the transmissive portion 9a of the imaging object 9 (FIG. 16A).

Figure 16B:
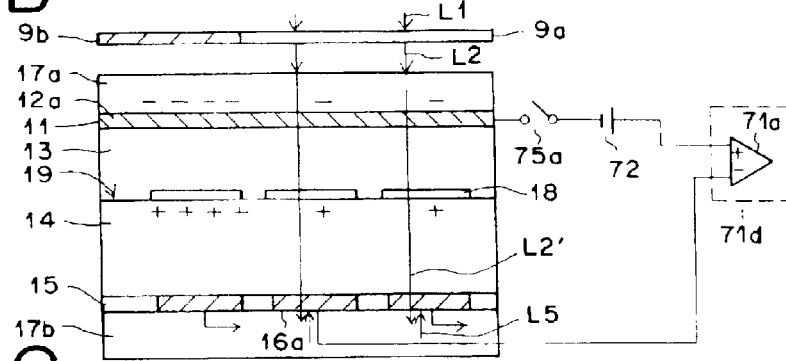
Figure 16C:
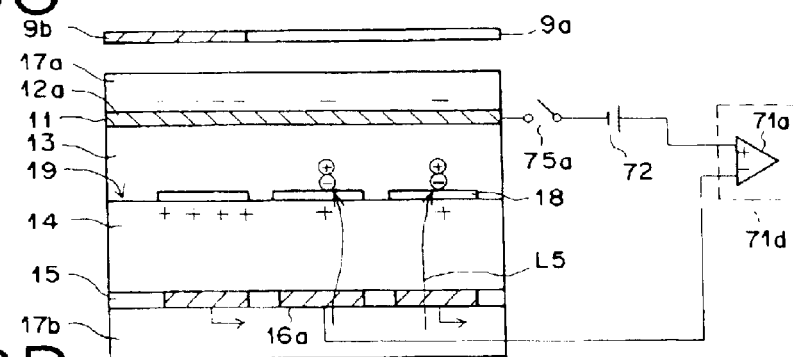
Figure 16D:
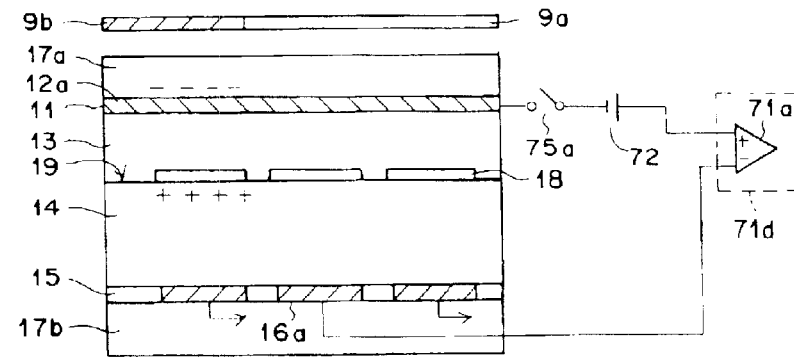

Moreover, some of the recording light L2 is transmitted through the fluorescent material 17a without being converted into the fluorescent light L4 inside the fluorescent material 17a. The transmitted recording light L2' is further transmitted through the first electrode layer 11, the first rectifying layer 13, the second rectifying layer 14 and the second electrode layer 15, and the recording light L2' eventually excites the fluorescent material 17b. In this way, the fluorescent material 17b emits the fluorescent light L5 in an amount corresponding to a dosage of the recording light L2' (FIG. 16B). The fluorescent light L5 passes through the second electrode layer 15 and the second rectifying layer 14, and then generates positive and negative charge pairs in an amount corresponding to the amount of the fluorescent light L5 inside the first rectifying layer 13 (FIG. 16C). Thereafter, similar actions to the above-described actions by the fluorescent light L4 take place, whereby the electric charges on the elements 12a and the capacitor 19 eventually disappear (FIG. 16D).

As described above, if the fluorescent materials 17a and 17b are stacked on both sides of the detector 10c, it is possible to convert the part of recording light L2, which passes through one of the fluorescent materials stacked on the outside of one of the electrode layers of the detector 10c, into the fluorescent light by use of the other fluorescent material stacked on the outside of the other electrode layer. Accordingly, it is possible to generate the charge pairs additionally inside the first rectifying layer 13 by use of the fluorescent light emitted from the other fluorescent material. Therefore, the detector 10c can enhance efficiency of electric charge generation inside the first rectifying layer 13 as compared to the case of stacking just one fluorescent material outside one of the electrode layers such as the foregoing detector 10b according to the second embodiment. As a result, the detector 10c can increase a quantity of electric currents which are retrievable as signals. In addition, the S/N ratio can be further improved upon retrieval.

Although description has been made in the foregoing on the case of irradiating the recording light L2 from the fluorescent material 17a side, it is also possible to irradiate the recording light L2 from the fluorescent material 17b side. In this case, the microplates 18 are preferred to have transmittance with respect to the fluorescent light L5 emitted from the fluorescent material 17b at the minimum. Therefore, it is preferred to use publicly-known transparent conductive films such as ITO films for the microplates 18.

The detector 10, 10b or 10c according to any of the foregoing embodiments has a high retrieval rate, and uniform electric charges are accumulated in the capacitor 19 by application of a given voltage between the respective elements 12a and the elements 16a upon retrieval. In other words, the detector 10, 10b or 10c is charged in that event. The foregoing aspect is virtually equivalent to resetting the detector 10, 10b or 10c back to an initial state of recording. It is thereby possible to conduct so-called real-time detection. That is, it is possible to conduct real-time detection by serially switching the elements 16a so as to reset the second stripe electrode 16 back to an open-voltage recording state after electrification upon retrieval.

Here, if high resolution is not required and a large pixel size is therefore sufficient, then it is possible to reduce the number of pixels subject to retrieval by means of applying the voltage simultaneously to a plurality of elements 16a, or alternatively, by selectively retrieving the signals at intervals of several pixels as disclosed in Japanese Unexamined Patent Publication No. 7(1995)-72258. Accordingly, it is possible to reduce processing rates of the current detection circuit 70 connected to the detector and of a signal processing circuit subsequent to the current detection circuit 70.

The usage of such real-time detection includes an apparatus for conducting abdominal or cardiac photofluorography (motion video imaging) as disclosed in the Japanese Unexamined Patent Publication No. 7(1995)-193751, a cone beam CT as disclosed in Japanese Unexamined Patent Publication No. 7(1995)-116154, and the like.

Figure 17:
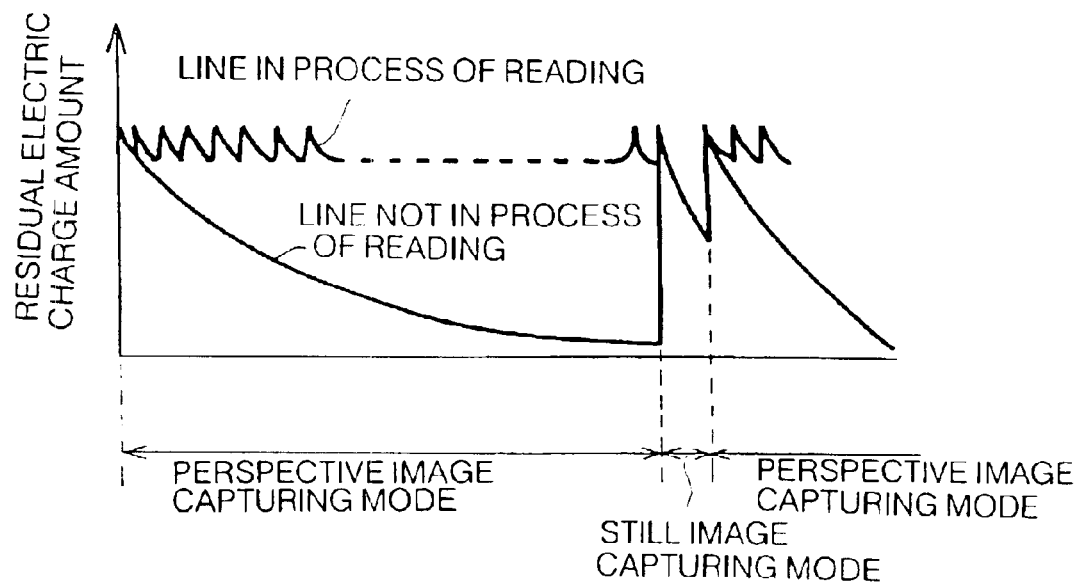
FIG. 17 is a graph showing one example of a timing chart in a case of switching photofluorography as real-time detection and still image capturing.

In addition, it is also possible to select desired imaging modes by switching the photofluorography as real-time detection and a still image capturing. FIG. 17 shows one example of a timing chart in the event of switching between a photofluorographic mode and a still image capturing mode while conducting selective retrieval during the photofluorographic mode. As shown in the drawing, the selective retrieval causes deviation of response waveforms between a line subject to retrieval and a line not subject to retrieval during the photofluorographic mode. Nevertheless, such deviation does not cause any problem, because the uniform electric charges are accumulated in the capacitor 19 in the event of still image capturing by applying the voltage between the elements 12a and the elements 16a relevant to all the lines using the power source 72.

The present invention has been described with reference to the preferred embodiments of the image detector, the method and the apparatus for recoding image information on the detector, and the method and the apparatus for retrieving the image information out of the detector which records the image information. However, it should be understood that the present invention is not limited to the above-described embodiments, and that various changes, modifications and alterations can be made therein without departing from scope and spirit of the invention.

For example, in the foregoing description, the diode (the rectifier element) 13d is formed on the first rectifying layer 13, in which the p-type a-Si layer 13c is an anode and the n-type a-Si layer 13a is a cathode, and the diode (the rectifier element) 14d is formed on the second rectifying layer 14, in which the p-type a-Si layer 14a is an anode and the n-type a-Si layer 14c is a cathode. However, those directions of the diodes may be reversed severally. In that case, the aspect of connection of the power source 72 and the like, which constitute the current detection circuit 70, may be modified so as to correspond to modification of the directions of the diodes.

Moreover, in the foregoing description, the microplates are provided between the first rectifying layer and the second rectifying layer in order to form the capacitor favorably. However, without limitations to the foregoing, the present invention may adopt any constitution so far as the capacitor for accumulating electric charges for a latent image can be formed on an inner side or in the vicinity of the inner side of the first rectifying layer. For example, a well-known trapping layer for capturing and accumulating electric charges for a latent image that represent an electrostatic latent image (as disclosed in U.S. Pat. No. 4,535,468) may be provided between the first rectifying layer and the second rectifying layer. Otherwise, a charge transfer layer, which functions almost as an insulator with respect to the electric charges for a latent image and functions almost as a conductor with respect to electric charges of the reverse polarity to the electric charges for a latent image (as disclosed in Japanese Unexamined Patent Publications No. 10(1998)-232824 and No. 10(1998)-271374), may be provided between the first rectifying layer and the second rectifying layer. When the trapping layer is provided, the electric charges for a latent image are retained and accumulated inside the trapping layer or on an interface between the trapping layer and the first rectifying layer. Meanwhile, when the charge transfer layer is provided, the electric charges for a latent image are retained and accumulated on an interface between the charge transfer layer and the first rectifying layer. Furthermore, while the trapping layer or the charge transfer layer is provided, it is also possible to provide additional minute conductive members such as the microplates independently of the respective pixels.

Furthermore, description has been made in the foregoing that each of the detectors 10b and 10c according to the second and the third embodiments adopted the constitution of integrating the fluorescent material into the detector. However, without limitations to the foregoing, the fluorescent material and the detector may be formed separately, and in the event of recording, the fluorescent material may be disposed in front of the detector 10 upon irradiation of the recording light.

What is claimed is:

1. An image detector including a capacitor for accumulating electric charges corresponding to an amount of an electromagnetic wave irradiated for recording and thereby recording image information on the capacitor as an electrostatic latent image, the image detector comprising:

a first electrode layer having a first stripe electrode composed of multiple line electrodes;

a first rectifying layer which takes on conductivity by receiving irradiation of the electromagnetic wave for recording;

a capacitor;

a second rectifying layer having a reverse polarity to the first rectifying layer; and a second electrode layer having a second stripe electrode composed of multiple line electrodes intersecting the line electrodes of the first stripe electrode, wherein the foregoing constituents are stacked in accordance with the order listed above.

2. The image detector according to claim 1, wherein each of the first and the second rectifying layers is made of serial lamination of an n-type semiconductor, an insulator and a p-type semiconductor, at least any one of the n-type semiconductors and the p-type semiconductors of the first and the second rectifying layers disposed opposite to the capacitor is partitioned into pixels so as to correspond to pixel positions defined by the first stripe electrode and the second stripe electrode, and at least any one of the n-type semiconductors and the p-type semiconductors of the first and the second rectifying layers disposed opposite to the relevant stripe electrodes is partitioned into pixels in any of a stripe manner so as to correspond to the relevant stripe electrode and a manner so as to correspond to the pixel positions.

3. The image detector according to claim 1, wherein the capacitors are provided independently of the pixel positions, the capacitors are electrically unconnected to one another, and the capacitors are made of a conductive member to equalize the electric charges to the same electric potential.

4. The image detector according to claim 1, wherein a fluorescent material, which emits light with a wavelength different from a wavelength of the electromagnetic wave for recording, provided on an outside of the first electrode layer, said emission being caused by excitation through irradiation of the electromagnetic wave.

5. The image detector according to claim 1, wherein the second rectifying layer possesses transmittance with respect to the electromagnetic wave for recording.

6. The image detector according to claim 5, wherein the second rectifying layer is composed of multiple rectifier elements formed such that a size of each element is designed in a size within ⅔ of a minimum resolvable pixel size, and spaces between the respective rectifier elements are made of a material which possesses transmittance with respect to the electromagnetic wave for recording.

7. The image detector according to claim 6, wherein a fluorescent material, which emits light with a wavelength different from a wavelength of the electromagnetic wave for recording, is provided on an outside of the second electrode layer, said emission being caused by excitation through irradiation of the electromagnetic wave.

8. The image detector according to claim 5, wherein a fluorescent material, which emits light with a wavelength different from a wavelength of the electromagnetic wave for recording, is provided on an outside of the second electrode layer, said emission being caused by excitation through irradiation of the electromagnetic wave.

9. An image recording apparatus for recording image information on the capacitor as the electrostatic latent image by irradiating the electromagnetic wave for recording on the image detector according claim 1 so as to accumulate electric charges on the capacitor in an amount corresponding to a dosage of the electromagnetic wave, the image recording apparatus comprising:

recording voltage applying means for applying a given voltage between the first stripe electrode and the second stripe electrode and thereby accumulating almost uniform electric charges in the capacitor; and controlling means for controlling the recording voltage applying means and irradiation of the electromagnetic wave such that the electromagnetic wave for recording is irradiated on the image detector after stopping application of the given voltage.

10. An image retrieving apparatus for retrieving the image information from the image detector according to claim 1 which records the image information as the electrostatic latent image, the image retrieving apparatus comprising:

retrieving voltage applying means for applying a given voltage between each line electrode of the first stripe electrode and respective line electrodes of the second stripe electrode; and image signal obtaining means for obtaining an electric signal at a level corresponding to an amount of electric charges accumulated on the capacitor by detecting a charged current flowing into the image detector owing to application of the voltage.

11. A method of fabricating the image detector according to claim 2, the method comprising the steps of:

forming the second electrode layer;

forming a semiconductor of a first type to be selected from any of the n-type semiconductor and the p-type semiconductor into a film on the second electrode layer;

etching the semiconductor film of the first type so as to be disposed opposite to the second stripe electrode;

forming the insulator of the second rectifying layer on the etched semiconductor film of the first type;

forming a semiconductor of a second type to be selected from any of the n-type semiconductor and the p-type semiconductor and to be reverse to the first type into a film on the insulator;

etching the semiconductor film of the second type so as to be disposed opposite to the second stripe electrode and to form desired pixel pitch and pixel width in a longitudinal direction of the second stripe electrode;

forming the capacitor on the etched semiconductor film of the second type;

forming the semiconductor of the same type as the second type into a film on the capacitor;

etching the semiconductor film of the same type as the second type so as to be disposed opposite to the capacitor;

forming the insulator of the first rectifying layer on the etched semiconductor film of the same type as the second type;

forming the semiconductor of the same type as the first type into a film on the insulator;

etching the semiconductor film of the same type as the first type so as to be disposed opposite to a position of arrangement of the etched semiconductor film of the same type as the second type and to be formed in a stripe manner while intersecting the second stripe electrode;

forming an electrode material to constitute the first electrode layer into a film on the etched semiconductor film of the same type as the first type; and etching the first stripe electrode in a stripe manner so as to be disposed opposite to the etched semiconductor film of the same type as the first type.

12. The method of fabricating the image detector according to claim 11, wherein the method further comprises at least any one of the steps of:

etching the semiconductor of the first type selected from the n-type semiconductor and the p-type semiconductor so as to form desired pixel pitch and pixel width in a longitudinal direction of the second stripe electrode; and etching the semiconductor of the same type as the first type so as to form desired pixel pitch and pixel width in a longitudinal direction of the first stripe electrode.

13. An image recording method for recording image information on a capacitor as an electrostatic latent image by irradiating an electromagnetic wave for recording onto the image detector as in claim 1 and thereby accumulating electric charges in an amount corresponding to an amount of the electromagnetic wave on the capacitor, the image recording method comprising the steps of:

accumulating almost uniform electric charges in the capacitor by applying a given voltage between the first stripe electrode and the second stripe electrode; and stopping application of the voltage and irradiating the electromagnetic wave for recording onto the image detector to perform recording.

14. The image recording method according to claim 13, wherein a fluorescent material, which emits light with a wavelength different from a wavelength of the electromagnetic wave for recording, is provided so as to face any one of the first electrode layer and the second electrode layer, said emission being caused by excitation through irradiation of the electromagnetic wave, and the electromagnetic wave for recording is irradiated on the electrode layer on which the fluorescent material is not provided.

15. An image recording method for recording image information on a capacitor as an electrostatic latent image by irradiating an electromagnetic wave for recording onto the image detector as in any one of claims 4 and 8, which are provided with the fluorescent material only on the outside of any one of the first electrode layer and the second electrode layer, and thereby accumulating electric charges in an amount corresponding to an amount of the electromagnetic wave on the capacitor, the image recording method comprising the steps of:

accumulating almost uniform electric charges in the capacitor by applying a given voltage between the first stripe electrode and the second stripe electrode; and stopping application of the voltage and irradiating the electromagnetic wave for recording onto the image detector to perform recording, wherein the electromagnetic wave for recording is irradiated on the electrode layer on which the fluorescent material is not provided.

16. An image retrieving method for retrieving the image information from the image detector according to claim 1, which records the image information as the electrostatic latent image, the image retrieving method comprising the steps of:

applying a given voltage between each line electrode of the first stripe electrode and respective line electrodes of the second stripe electrode; and obtaining an electric signal at a level corresponding to an amount of electric charges accumulated in the capacitor by detecting a charged current flowing into the image detector owing to application of the voltage.

* * * * *